(12) United States Patent
Mokhlesi et al.

(10) Patent No.: US 7,691,710 B2
(45) Date of Patent: Apr. 6, 2010

(54) FABRICATING NON-VOLATILE MEMORY WITH DUAL VOLTAGE SELECT GATE STRUCTURE

(75) Inventors: Nima Mokhlesi, Los Gatos, CA (US); Masaaki Higashitani, Cupertino, CA (US)

(73) Assignee: Sandisk Corporation, Milpitas, CA (US)

( * ) Notice: Subject to any disclaimer, the term of this patent is extended or adjusted under 35 U.S.C. 154(b) by 586 days.

(21) Appl. No.: 11/550,386

(22) Filed: Oct. 17, 2006

(65) Prior Publication Data

US 2008/0090351 A1 Apr. 17, 2008

(51) Int. Cl.
*H01L 21/336* (2006.01)
*H01L 21/8234* (2006.01)
*H01L 21/3205* (2006.01)
*H01L 21/4763* (2006.01)

(52) U.S. Cl. .................. 438/266; 438/257; 438/275; 438/592; 257/E21.179; 257/E21.68

(58) Field of Classification Search .................. 438/266, 438/592, 275, 257; 257/E21.179, E21.68
See application file for complete search history.

(56) References Cited

U.S. PATENT DOCUMENTS

| 5,386,422 | A | 1/1995 | Endoh |
| 5,522,580 | A | 6/1996 | Varner, Jr. |
| 5,570,315 | A | 10/1996 | Tanaka |
| 5,590,072 | A | 12/1996 | Choi |
| 5,774,397 | A | 6/1998 | Endoh |
| 5,793,677 | A | 8/1998 | Hu et al. |
| 6,046,935 | A | 4/2000 | Takeuchi |
| 6,180,454 | B1 * | 1/2001 | Chang et al. ............ 438/257 |
| 6,222,762 | B1 | 4/2001 | Guterman |
| 6,456,528 | B1 | 9/2002 | Chen |
| 6,522,580 | B2 | 2/2003 | Chen |
| 6,677,199 | B1 | 1/2004 | Chang |
| 6,760,253 | B2 | 7/2004 | Kamei |

(Continued)

FOREIGN PATENT DOCUMENTS

WO 0225733 3/2002

OTHER PUBLICATIONS

Response to Office Action dated Oct. 23, 2008, U.S. Appl. No. 11/550,383, filed Oct. 17, 2006.

(Continued)

*Primary Examiner*—David S Blum
*Assistant Examiner*—Daniel Luke
(74) *Attorney, Agent, or Firm*—Vierra Magen Marcus & DeNiro LLP

(57) ABSTRACT

A select gate structure for a non-volatile storage system include a select gate and a coupling electrode which are independently drivable. The coupling electrode is adjacent to a word line in a NAND string and has a voltage applied which reduces gate induced drain lowering (GIDL) program disturb of an adjacent unselected non-volatile storage element. In particular, an elevated voltage can be applied to the coupling electrode when the adjacent word line is used for programming. A reduced voltage is applied when a non-adjacent word line is used for programming. The voltage can also be set based on other programming criterion. The select gate is provided by a first conductive region while the coupling electrode is provided by a second conductive region formed over, and isolated from, the first conductive region.

14 Claims, 28 Drawing Sheets

U.S. PATENT DOCUMENTS

| | | | |
|---|---|---|---|
| 6,845,042 | B2 | 1/2005 | Ichige |
| 6,859,397 | B2 | 2/2005 | Lutze |
| 7,046,568 | B2 | 5/2006 | Cernea |
| 7,061,040 | B2 | 6/2006 | Shih |
| 7,196,928 | B2 | 3/2007 | Chen |
| 7,259,991 | B2 | 8/2007 | Aritome |
| 2001/0002713 | A1 | 6/2001 | Goda et al. |
| 2003/0094635 | A1 | 5/2003 | Yaegashi |
| 2004/0057287 | A1 | 3/2004 | Cernea |
| 2004/0109357 | A1 | 6/2004 | Cernea |
| 2004/0238849 | A1 | 12/2004 | Miwa |
| 2004/0255090 | A1 | 12/2004 | Guterman |
| 2005/0024939 | A1 | 2/2005 | Chen |
| 2006/0039230 | A1 | 2/2006 | Kurata |
| 2006/0040447 | A1 | 2/2006 | Violette |
| 2006/0092703 | A1 | 5/2006 | Chae |
| 2006/0108628 | A1 | 5/2006 | Hung et al. |
| 2006/0126390 | A1 | 6/2006 | Gorobets |
| 2006/0140007 | A1 | 6/2006 | Cernea |
| 2006/0158947 | A1 | 7/2006 | Chan |
| 2006/0227613 | A1 | 10/2006 | Joo |
| 2007/0047312 | A1 | 3/2007 | Aritome |

OTHER PUBLICATIONS

Notice of Allowance dated Jan. 16, 2009, U.S. Appl. No. 11/550,383, filed Oct. 17, 2006.
Response to Office Action dated Dec. 10, 2007, U.S. Appl. No. 11/550,383, filed Oct. 17, 2006.
J.D. Lee, "A New Programming Disturbance Phenomenon in NAND Flash Memory by Source/Drain Hot-Electrons Generated by GIDL Current," 21st IEEE NVSMW, Feb. 12-16, 2006, Monterey, CA, pp. 31-33.
International Search Report dated Feb. 5, 2008, Int'l Application No. PCT/US2007/080745, Filed Aug. 10, 2007.
International Search Report dated Feb. 5, 2009, Int'l Application No. PCT/US2007/080746, Filed Aug. 10, 2007.
Notice of Allowance dated Mar. 9, 2009, U.S. Appl. No. 11/550,382, filed Oct. 17, 2006.
U.S. Appl. No. 11/550,382, filed Oct. 17, 2006.
U.S. Appl. No. 11/550,383, filed Oct. 17, 2006.
Office Action dated Sep. 26, 2007 in U.S. Appl. No. 11/550,383.
Office Action dated Jul. 23, 2008, U.S. Appl. No. 11/550,383, filed Oct. 17, 2006.
Amendment to the Claims, dated Apr. 30, 2009, U.S. Appl. No. 11/550,382, filed Oct. 17, 2006.

* cited by examiner

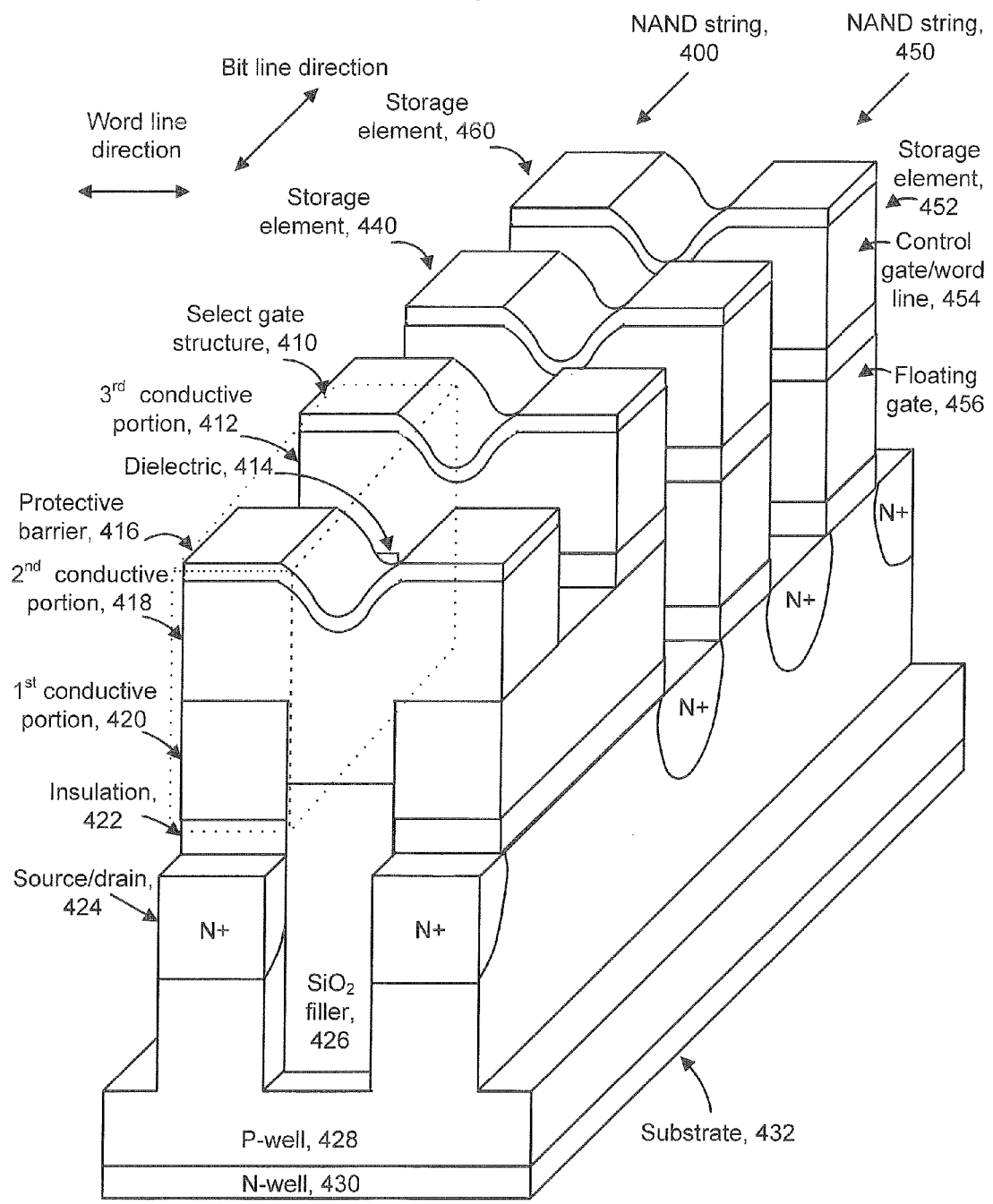

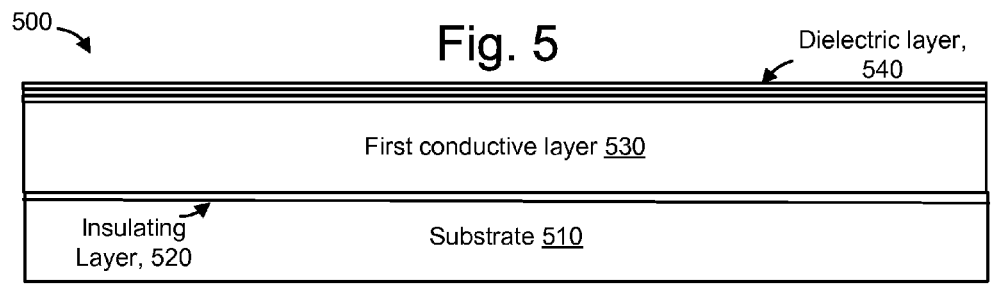
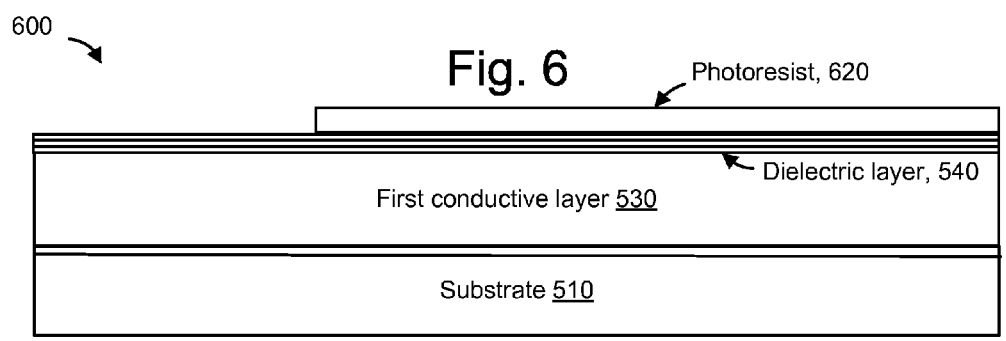
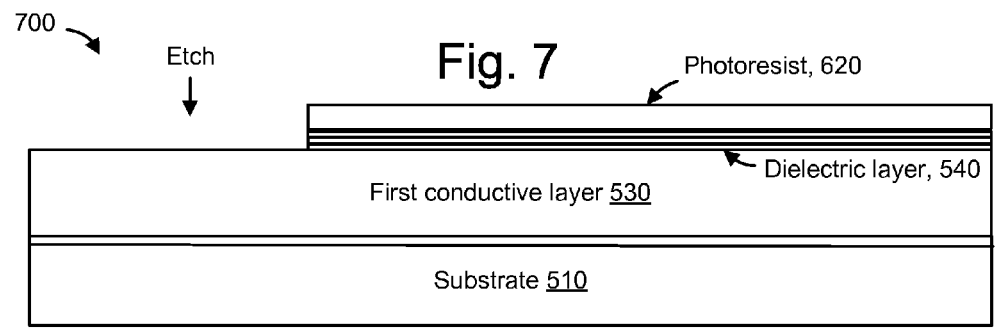
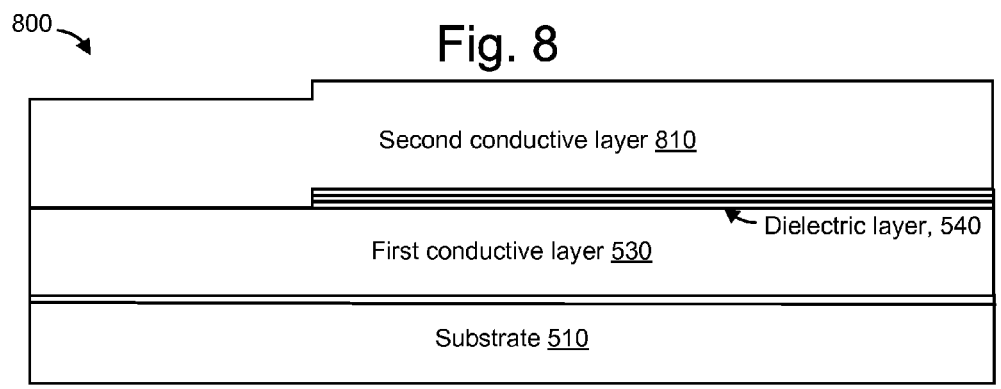

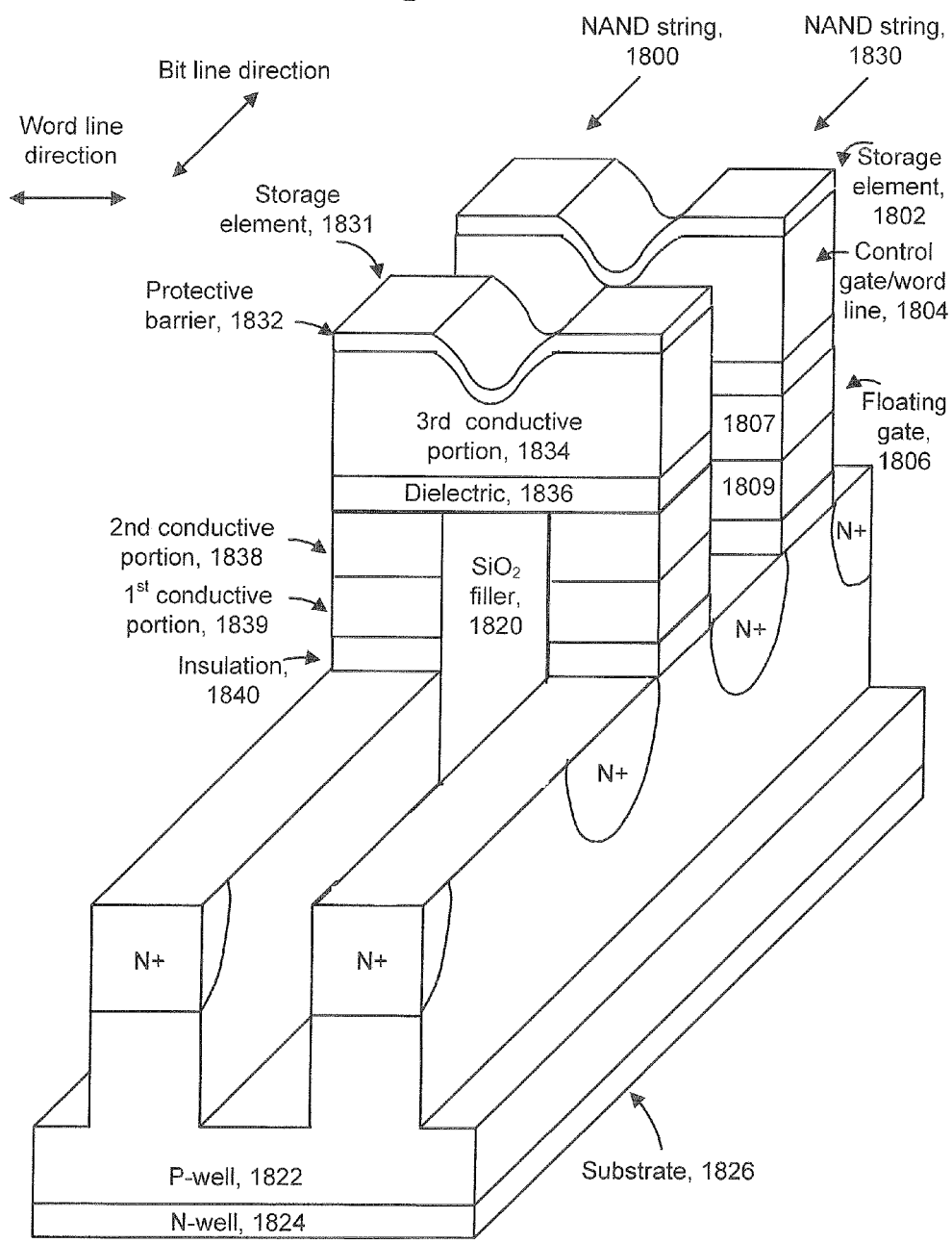

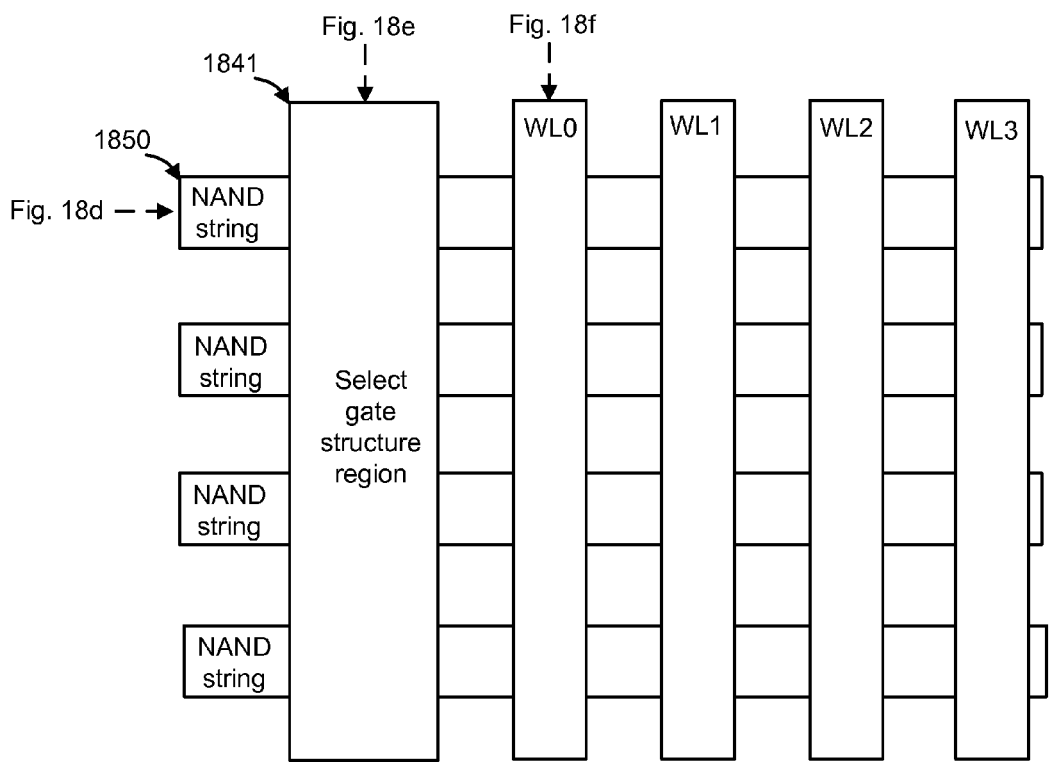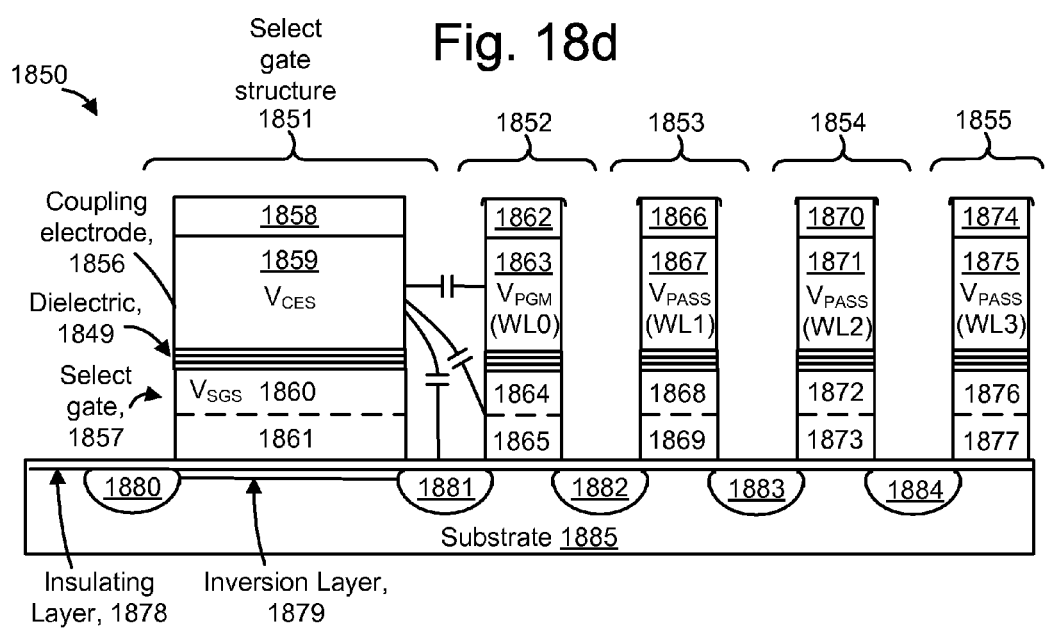

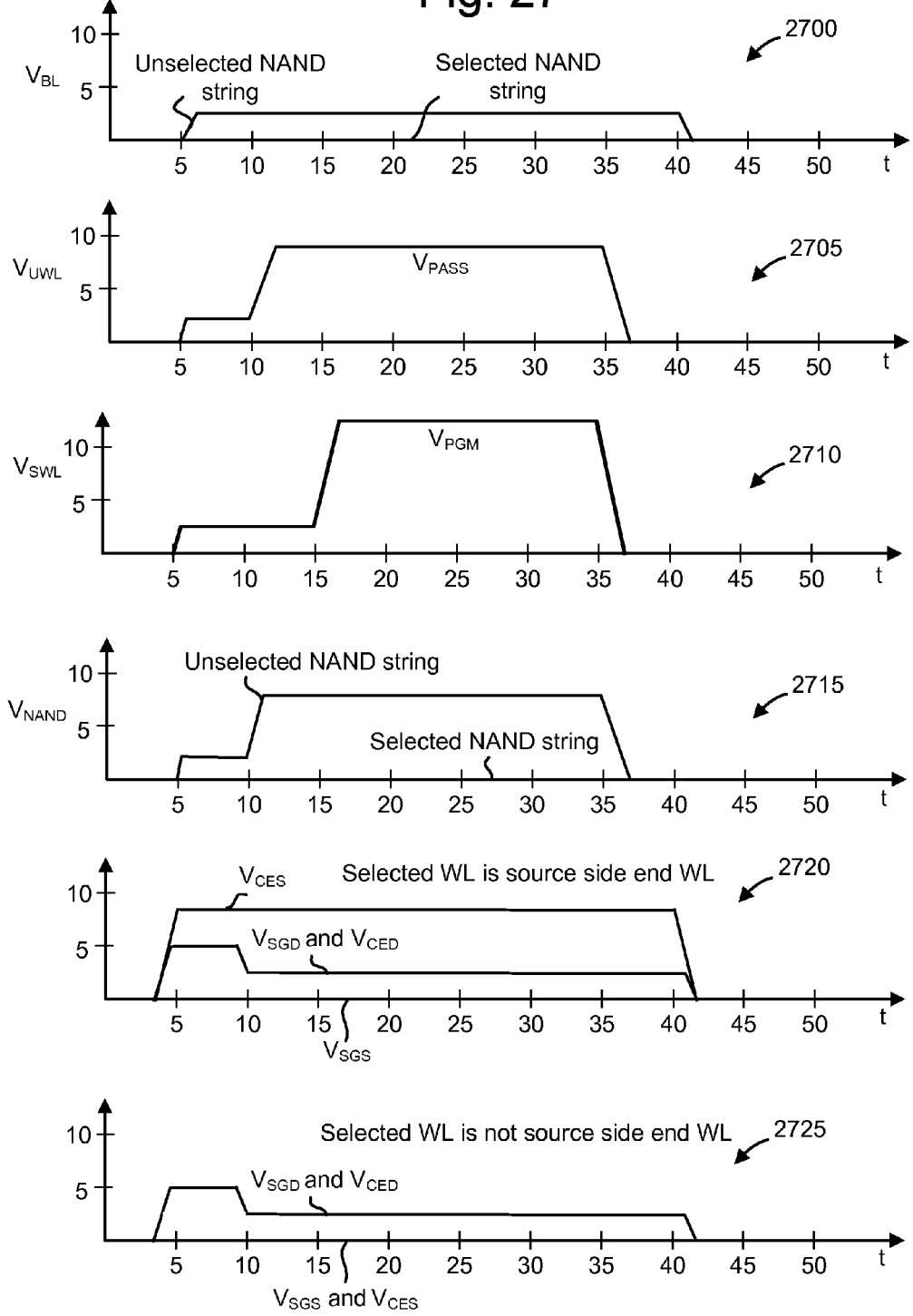

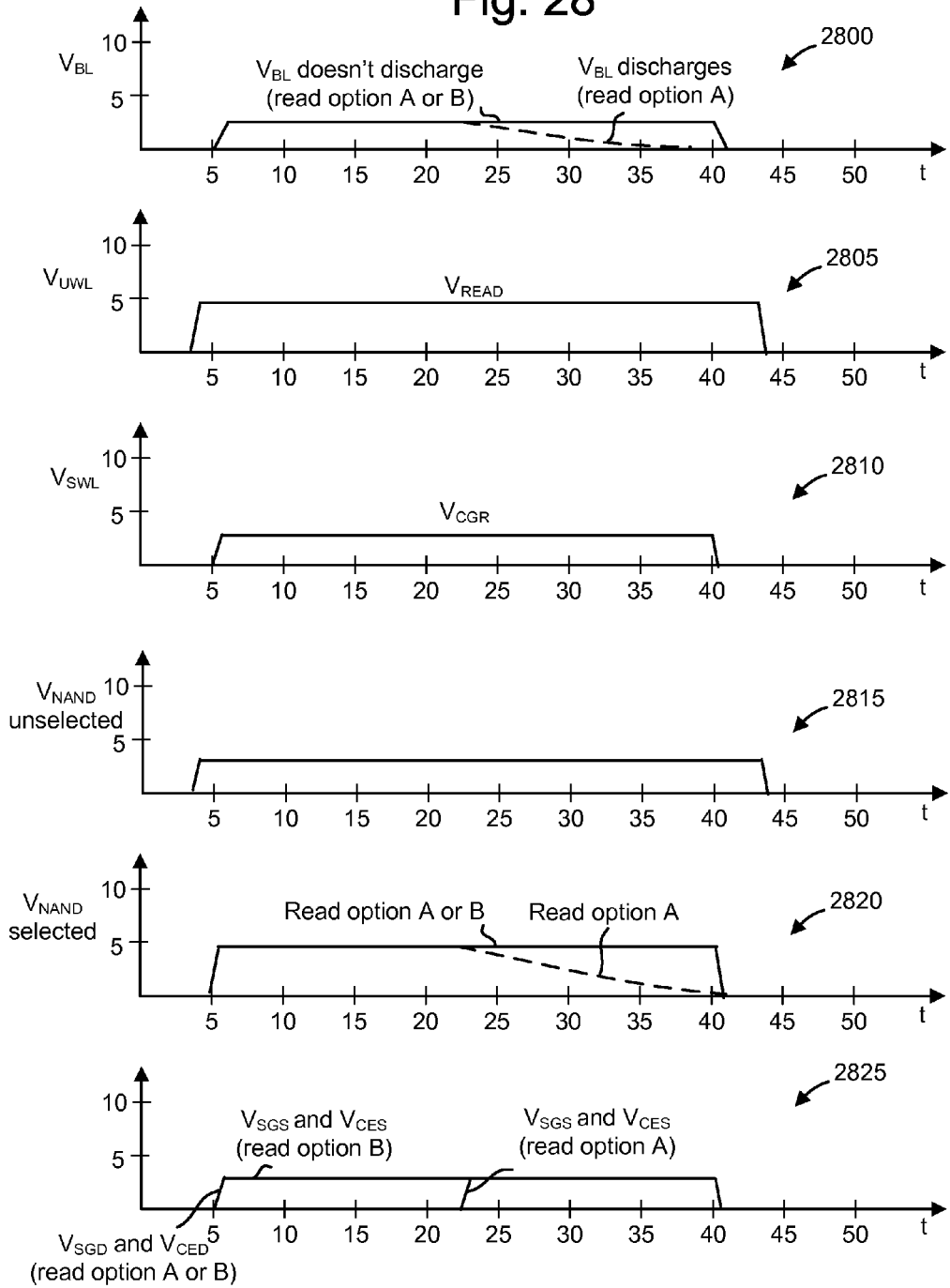

FABRICATING NON-VOLATILE MEMORY WITH DUAL VOLTAGE SELECT GATE STRUCTURE

CROSS-REFERENCE TO RELATED APPLICATIONS

This application is related to, commonly assigned U.S. patent application Ser. No. 11/550,382, filed Oct. 17, 2006, published as US2008/0089127 on Apr. 17, 2008, titled "Non-Volatile Memory With Dual Voltage Select Gate Structure", and, commonly assigned U.S. patent application Ser. No. 11/550,383, filed Oct. 17, 2006, published as US2008/0089128 on Apr. 17, 2008, titled "Programming Non-Volatile Memory With Dual Voltage Select Gate Structure", each of which is incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Pub. 2005/0024939, titled "Detecting Over Programmed Memory," published Feb. 3, 2005; both of which are incorporated herein by reference in their entirety.

However, various forms of program disturb including Gate Induced Drain Lowering program disturb have been experienced during programming due to the proximity of the non-volatile storage elements to one another. Moreover, this problem is expected to worsen with further scaling of NAND technology. Program disturb occurs when the threshold voltage of a previously-programmed non-volatile storage element is shifted due to subsequent programming of other non-volatile storage elements.

SUMMARY OF THE INVENTION

The present invention addresses the above and other issues by providing a non-volatile memory with dual voltage select gate structures, and methods for fabricating and programming such a non-volatile memory.

In one embodiment, a method for fabricating a select gate structure includes forming a first conductive portion over a substrate, forming a dielectric portion over a first part of the first conductive portion and over the substrate, forming a second conductive portion over the dielectric portion, the dielectric portion electrically isolating the first conductive portion from the second conductive portion and forming control lines for independently driving the first and second conductive portions.

In another embodiment, a method for fabricating a select gate structure includes forming a first conductive portion over an insulating layer on a substrate, and forming a second conductive portion over a first part of the first conductive portion, where the second conductive portion is electrically coupled to the first conductive portion. The method further includes forming a dielectric portion over a second part of the first conductive portion and forming a third conductive portion over the dielectric portion, where the third conductive portion is electrically isolated from the first conductive portion by the dielectric portion and spaced apart from the second conductive portion.

In another embodiment, a method for fabricating a select gate structure in a non-volatile storage system includes forming first conductive portions over a substrate, where the first conductive portions are spaced apart in a word line direction. The method further includes forming a second conductive portion over, and electrically coupled to, each first conductive portion. The second conductive portion extends continuously in a word line direction. Further, the second conductive portion and the spaced apart first conductive portions provide spaced apart select gates. The method further includes forming a third conductive portion over the second conductive portion, electrically insulated from the second conductive portion, and extending continuously in the word line direction. The third conductive portion provides a coupling electrode.

BRIEF DESCRIPTION OF THE DRAWINGS

FIG. 4a depicts a perspective view of NAND strings with dual voltage select gate structures.

FIG. 4b depicts a perspective view of storage elements of the NAND string of FIG. 4a.

FIGS. 5-14 depict a process for fabricating a NAND string having a dual voltage select gate structure.

FIG. 5 depicts a cross-sectional view of an unpatterned layered semiconductor material.

FIG. 6 depicts the semiconductor material of FIG. 5 after a photo resist has been deposited.

FIG. 7 depicts the semiconductor material of FIG. 6 after a portion of the dielectric layer has been removed.

FIG. 8 depicts the semiconductor material of FIG. 7 after a second conductive layer has been added.

FIG. 9 depicts the semiconductor material of FIG. 8 after protective barriers have been added.

FIG. 10 depicts the semiconductor material of FIG. 9 after removal of portions of the second conductive layer.

FIG. 11 depicts the semiconductor material of FIG. 10 after depositing a protective layer.

FIG. 12 depicts the semiconductor material of FIG. 11 after removing portions of the first conductive layer and dielectric layer and forming source/drain regions.

FIG. 13 depicts the semiconductor material of FIG. 12 after forming sidewall spacers.

FIG. 14 depicts programming of the semiconductor material of FIG. 13 including voltages applied to the select gate and coupling electrode of the select gate structure, and coupling of voltage from the coupling electrode.

FIGS. 18a-18i relate to another embodiment of NAND strings with dual voltage select gate structures.

FIG. 18a depicts another embodiment of NAND strings with dual voltage select gate structures.

FIG. 18b depicts a perspective view of storage elements of the NAND string of FIG. 18a.

FIG. 18c depicts an arrangement of a select gate structure with respect to NAND strings and word lines.

FIG. 18d depicts a cross-sectional view along a NAND string of the arrangement of FIG. 18c.

FIG. 18e depicts a cross-sectional view along a select gate structure of the arrangement of FIG. 18c.

FIG. 18f depicts a cross-sectional view along a word line of the arrangement of FIG. 18c.

FIG. 18g depicts an arrangement of a select gate structure with respect to NAND strings and word lines, showing a shunt area and a contact.

FIG. 18h depicts a cross-sectional view along a select gate structure of the arrangement of FIG. 18g.

FIG. 18i depicts an overview of a process for fabricating an alternative embodiment of a semiconductor material with a select gate structure.

FIG. 27 depicts a timing diagram describing various embodiments of a process for programming non-volatile memory.

FIG. 28 depicts a timing diagram describing various embodiments of a process for reading non-volatile memory.

DETAILED DESCRIPTION

Figure 1:
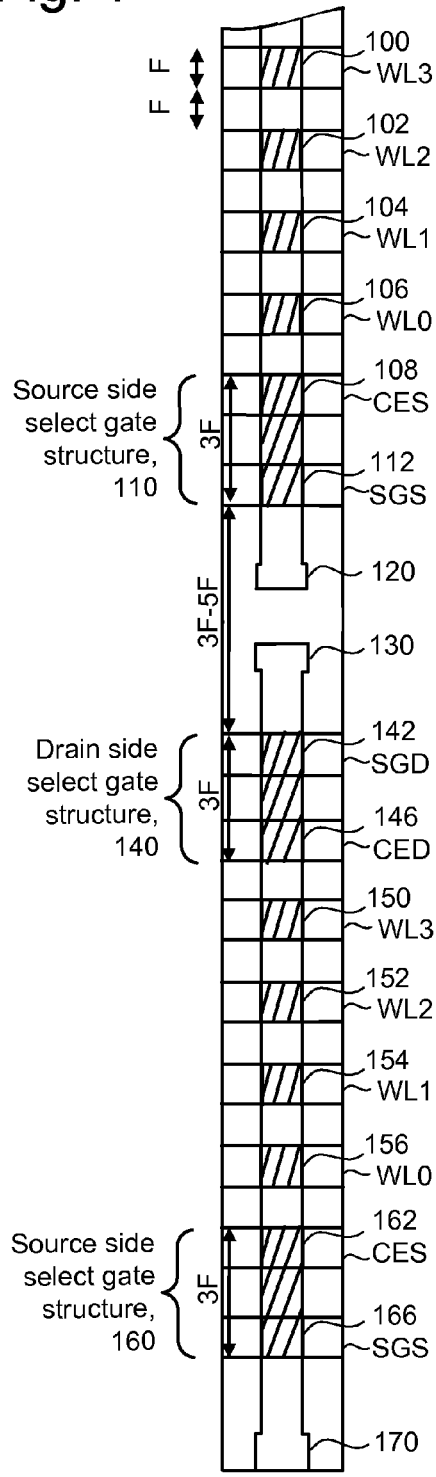
FIG. 1 is a top view of two adjacent NAND strings with select gate structures.

One example of a non-volatile memory system suitable for use with the present invention uses a NAND flash memory structure, in which multiple transistors are arranged in series between two select gates in a NAND string. FIG. 1 is a top view showing two NAND strings arranged one after another. In practice, a number of such NAND strings can be arranged one after another in a two-dimensional array across a semiconductor device and, optionally, in three dimensions. The NAND strings depicted in FIGS. 1 and 2 each include four transistors in series and sandwiched between select gate structures. For example NAND string #1 includes transistors 100, 102, 104 and 106 sandwiched between a drain side select gate structure (not shown) and a source side select structure 110 which includes a source side select gate (SGS) 112 and a source side coupling electrode (CES) 108. NAND string #2 includes transistors 150, 152, 154 and 156 sandwiched between a drain side select gate structure 140, which includes a drain side select gate (SGD) 142 and a drain side coupling electrode (CED) 146, and a source side select gate structure 160 which includes a source side select gate (SGS) 166 and a source side coupling electrode (CES) 162. Note that the depiction of one end region of NAND string #1 has been cut off on the drain side.

In NAND string #1, for instance, a select gate (not shown) connects the NAND string to a bit line contact (not shown) on one end and the select gate 112 connects the NAND string to a source line contact 120 on the other end. Similarly, in NAND string #2, select gate 142 connects the NAND string to a bit line contact 130 on one end and the select gate 166 connects the NAND string to a source line contact 170 on the other end. The select gates are controlled by applying appropriate voltages.

Further, in NAND string #1, each of the transistors 100, 102, 104 and 106 has a control gate and a floating gate. Specifically, transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG can be provided as portions of word lines WL3, WL2, WL1 and WL0, respectively. In one possible design, transistors 100, 102, 104 and 106 are each memory cells or non-volatile storage elements. In other designs, the memory elements may include multiple transistors or may be different than those depicted in FIGS. 1 and 2. Select gate 142 is connected to a drain select line, while select gates 112 and 166 are connected to the associated source select lines. NAND string #2 is arranged analogously to NAND string #1, and includes a contact 130 which is connected to a bit line on a drain side of the NAND string, while a contact 170 is connected to the common source select gate voltage. Additionally, the source side select gate 166 is connected to the associated source select line, and the drain side select gate 142 is connected to the associated drain select line. In NAND String #2, each of the transistors 150, 152, 154 and 156 has a control gate and a floating gate. Transistor 150 has control gate 150CG and floating gate 150FG. Transistor 152 includes control gate 152CG and floating gate 152FG. Transistor 154 includes control gate 154CG and floating gate 154FG. Transistor 156 includes a control gate 156CG and floating gate 156FG. Control gates 150CG, 152CG, 154CG and 156CG can be provided as portions of word lines WL3, WL2, WL1 and WL0, respectively. These are different word lines than those associated with NAND string #1.

The select gate structure can be provided on one end or on both ends of a NAND string. The use of a select gate structure having a coupling electrode and a select gate which are controllable by separate voltages provides a dual voltage select gate structure which provides a number of advantages when operating the NAND strings, as discussed further below.

In one possible implementation, F denotes the width of the word line, control gate and the floating gate of each memory element, as well as the spacing between memory elements, 3 F denotes the widths of the source and drain select gate structures, and 3 F or 5 F denotes the width of a space between the select gate structures of the adjacent NAND strings which is used for locating the contacts. Designs in which the select gate structures are wider than the memory elements are useful to prevent current leakage through the select gates.

Figure 3:
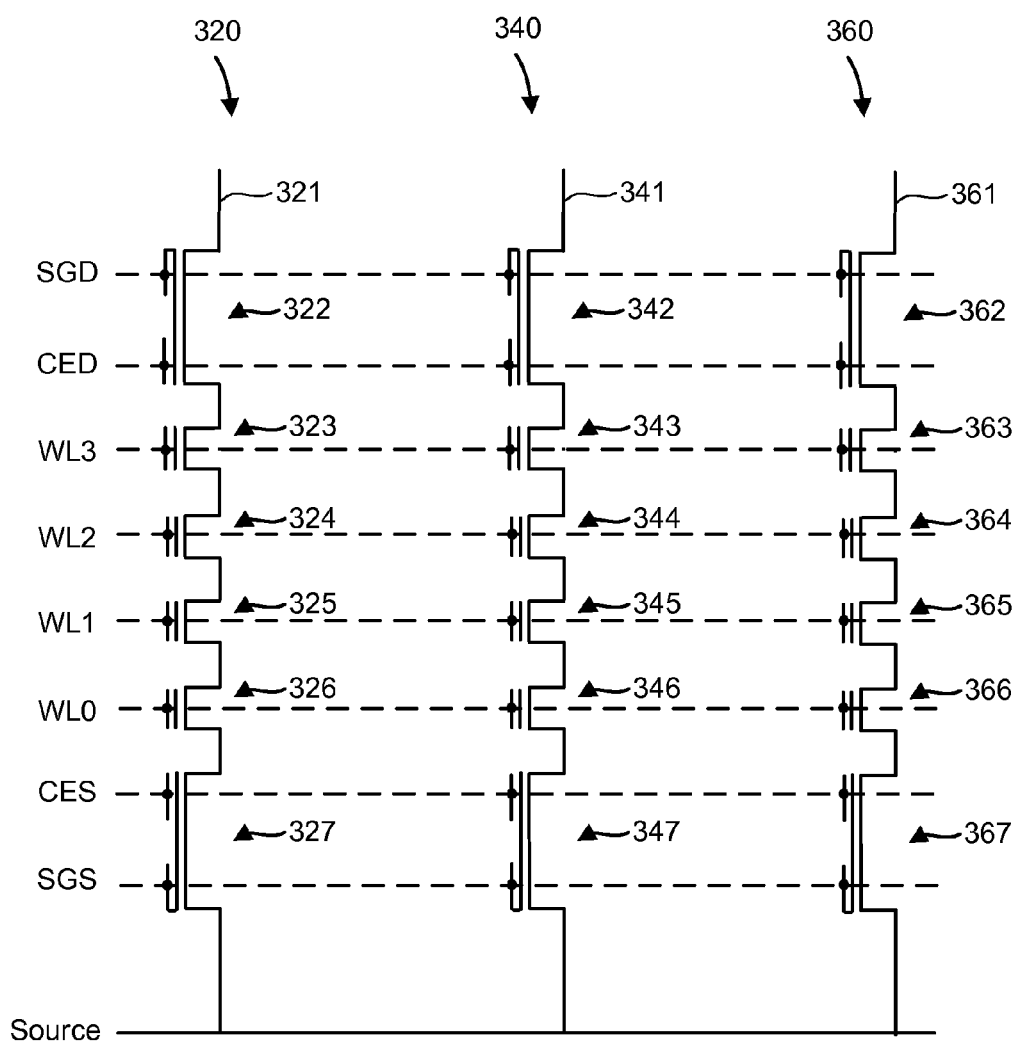
FIG. 3 is a circuit diagram depicting three NAND strings with select gate structures.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gate structures with respective select gate transistors and coupling elements, in addition to four storage elements. While four storage elements are illustrated for simplicity, modern NAND strings can have up to thirty-two or sixty-four storage elements, for instance.

For example, NAND string 320 includes select gate structures 322 and 327, and storage elements 323-326, NAND string 340 includes select gate structures 342 and 347, and storage elements 343-346, NAND string 360 includes select gate structures 362 and 367, and storage elements 363-366. Each NAND string is connected to the source line by its select gate structures (e.g., select gate structures 327, 347 or 367). A selection line SGS is used to control the source side select gates of the select gate structures. The various NAND strings 320, 340 and 360 are connected to respective bit lines 321, 341 and 361, by select transistors in the select gate structures 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Additionally, the coupling electrode of each select gate structure is adjacent to a storage element and word line. For example, the drain side coupling electrode (CED) of the select gate structure 322 is adjacent to the storage element 323 and WL3, and the source side coupling electrode (CES) of the select gate structure 327 is adjacent to the storage element 326 and WL0. As explained further below, the coupling electrode should be close to a storage element in order to influence the element through capacitive coupling.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, shifts in the charged stored in a storage element can occur when programming and reading a given storage element and other storage elements which have some degree of coupling with the given storage element, such as those sharing the same word line or bit line. Specifically, shifts in the stored charge levels occur because of field coupling between storage elements. The problem is exacerbated as the spaces between storage elements are being decreased due to improvements in integrated circuit manufacturing techniques. The problem occurs most markedly between two groups of adjacent storage elements that have been programmed at different times. One group of storage elements is programmed to add a level of charge that corresponds to one set of data. After a second group of storage elements is programmed with a second set of data, the charge levels read from the first group of storage elements often appear to be different than what was programmed due to capacitive coupling of the charges of the second group of storage elements to the first group of storage elements. Thus, the effects of coupling depend on the order in which the storage elements are programmed and, therefore, the order in which the word lines are traversed during programming. A NAND string is typically, but not always, programmed from the source side to the drain side, starting at the source side word line and proceeding, one word line at a time, to the drain side word line.

Capacitive coupling effects on a given storage element can be caused by other storage elements in the same word line and in the same NAND string, for instance. For example, storage element 344 may be part of a first group of storage elements, which includes other alternating storage elements along word line WL2, which store a page of data. Storage elements 324 and 364 may be part of a second group of storage elements which store another page of data. When the second group of storage elements is programmed after storage element 344, there will be a capacitive coupling to storage element 344. The coupling is strongest from the direct neighboring storage elements on the word line, which are storage elements 324 and 364.

Similarly, storage element 344 can be affected by programming of storage elements which are on the same NAND string 340 if they are programmed after storage element 344. For storage element 344, the coupling is strongest from the direct neighboring storage elements on the NAND string, which are storage elements 343 and/or 345. For example, if storage elements in the NAND string 340 are programmed in the order: 346, 345, 344, 343, storage element 344 can be affected by coupling from storage element 343. Generally, storage elements which are arranged diagonally with respect to storage element 344, namely storage elements 323, 363, 325 and 365, can provide about 20% of the coupling for storage element 344, whereas the direct neighboring storage elements 324 and 364, and 343 and 345 on the same word line or NAND string provide about 80% of the coupling. The coupling may be enough to shift the $V_{TH}$ of a storage element by about 0.5 V in some cases, which is sufficient to cause a read error and to widen the $V_{TH}$ distribution of a group of storage elements.

FIG. 4a depicts a perspective view of NAND strings with dual voltage select gate structures. Only a portion of the NAND strings is shown and various simplifications are made. In practice, analogous structures are formed across the semiconductor substrate in two dimensions, e.g., a bit line direction and a word line direction. Analogous NAND strings 400 and 450 are shown. NAND string 400 includes a select gate structure 410 (shown generally by a dashed box) and a number of storage elements, such as storage elements 440 and 460, extending in a bit line or NAND string direction. The select gate structure 410 includes a select gate formed by a first conductive portion 420 and a second conductive portion 418. The select gate structure 410 also includes a coupling electrode formed by a third conductive portion 412. The first conductive portion 420 of NAND string 400 is electrically isolated from other NAND strings. In contrast, the second conductive portion 418 and third conductive portion 412 can extend as control lines, e.g., word lines, across multiple NAND strings in a word line direction. In this manner, a control voltage applied to the second or third conductive portions is applied to each NAND string in a set of NAND strings. Similarly, control gate portions of the storage elements can extend as word lines across multiple NAND strings. For example, in the NAND string 450, a storage element 452 includes a control gate region 454 which extends across multiple NAND strings and a floating gate region 456 which is isolated from other NAND strings.

Protective barriers are provided over the select gate, coupling electrode and storage elements. For example, protective barrier 416 is provided over the second conductive portion 418 of the select gate. A dielectric layer 414 is provided between the third conductive portion 412 and part of the first conductive portion 420. The NAND strings are formed on a substrate 432 which includes an n-well region 430 and a p-well region 428. Using a shallow trench isolation technique, in one possible design, the p-well region 428 includes upwardly extending portions which are separated by a filler 426 such as $SiO_2$. The pattern of upwardly extending portions of the p-well separated by filler is repeated in a word line direction. Further, n+ source/drain doped regions, e.g., source/drain region 424, are provided in the p-well region spaced apart in the bit line direction. In particular, source/drain regions are provided on both sides of the select gate structure 410 and on both sides of the storage elements 440 and 460. An insulation layer 422 is provided on top of the substrate 432.

Figure 4B:
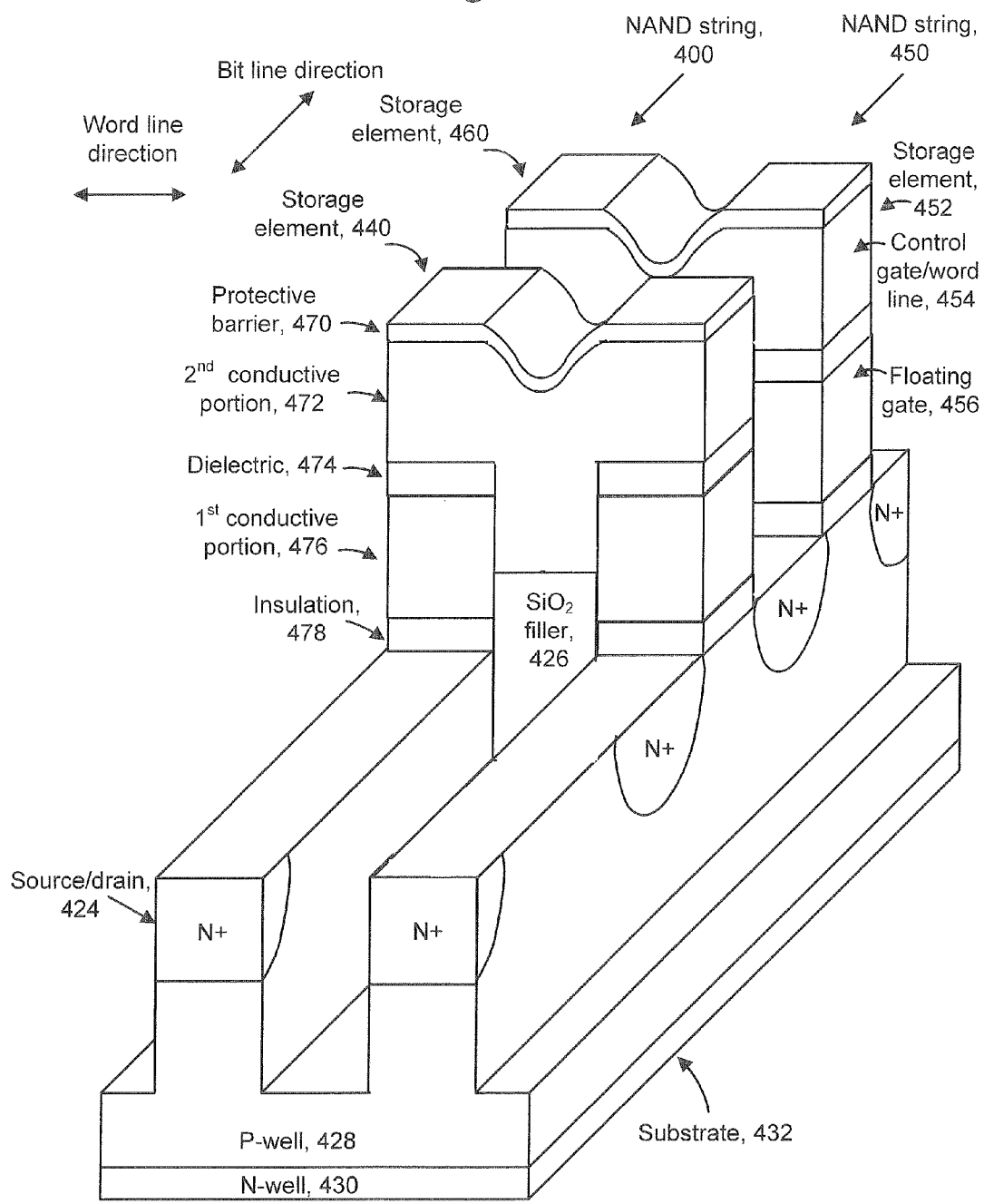

FIG. 4b depicts a perspective view of storage elements of the NAND string of FIG. 4a. This view does not include the select gate structure so that the storage elements can be seen more clearly. For instance, components of the storage element 440 which can be seen include the protective barrier 470, second conductive portion 472, dielectric 474, first conductive portion 476 and insulation 478.

FIGS. 5-14 depict a process for fabricating a NAND string having a dual voltage select gate structure. Note that the fabrication process described herein represent only one possible approach. Different fabrication processes can be used to arrive at the desired final structure. Note also that the figures are not to scale. Additionally, the fabrication of only a portion of a NAND string is shown. In practice, analogous structures can be formed across the semiconductor substrate in two dimensions, e.g., a bit line direction and a word line direction. A three dimensional structure can also be provided.

FIG. 5 depicts a cross-sectional view of an unpatterned layered semiconductor material 500 having a substrate, an insulating layer, a first conductive layer and a dielectric layer. The cross-section represents a bit line direction. A substrate layer 510 includes a semiconductor material such silicon. In one embodiment, n-well and p-well (active) regions are formed in the substrate 510. An insulating layer 520 includes an insulating material such as an insulating oxide is formed on the substrate 510. A first conductive layer 530 including a conductive material such as a polysilicon layer is formed on the insulating layer 520. A dielectric layer 540 including a dielectric material is formed on the first conductive layer 430. For example, the dielectric layer 540 can use an inter-poly dielectric (IPD) such as an oxide-nitride-oxide (ONO) layer.

FIG. 6 depicts the semiconductor material of FIG. 5 after a photo resist has been deposited, resulting in the semiconductor material 600. In particular, in one possible approach, a photo resist layer 620 is deposited on the dielectric layer 540, the photo resist layer is selectively exposed to UV light using a mask and the exposed portion of the photo resist is removed using a developer, thereby exposing a portion of the dielectric layer 540. An etch is performed to remove the exposed portion of the dielectric layer 540 which is not protected by the photo resist layer 620, resulting in the semiconductor material 700 of FIG. 7.

FIG. 7 depicts the semiconductor material of FIG. 6 after a portion of the dielectric layer has been removed, resulting in the semiconductor material 700. The photo resist layer 620 is removed and a second conductive layer 810 including a conductive material such as an additional polysilicon layer is deposited over the exposed portion of the first conductive layer 530 and over the remaining portion of the dielectric layer 540, resulting in the layered semiconductor structure 800 of FIG. 8. In particular, FIG. 8 depicts the semiconductor material of FIG. 7 after a second conductive layer 810 has been added. Removing a portion of the dielectric 540 allows the first and second conductive layers to electrically contact one another. In another approach, the dielectric layer can be formed in the desired location using a mask, leaving a portion of the first conductive layer exposed, so that subsequent removal of a portion of the dielectric layer is not required.

Figure 9:
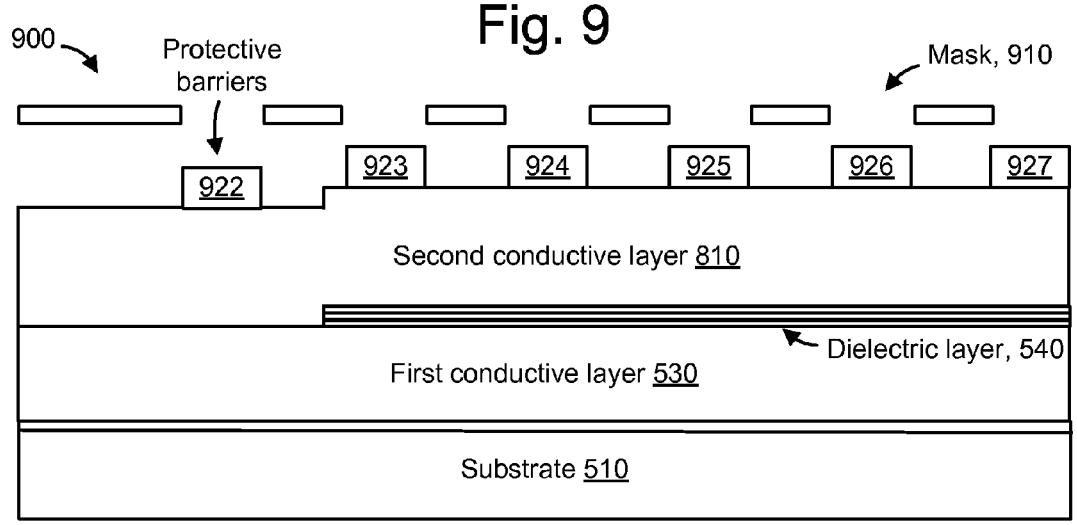

FIG. 9 depicts the semiconductor material of FIG. 8 after protective barriers have been added, resulting in the semiconductor material 900. A mask 910 is used to form a number of protective barriers 922, 923, 924, 925, 926 and 927 by transferring a pattern of the mask 910 to the semiconductor material. The protective barriers may be made of a dielectric material such as silicon nitride (SiN), in one possible approach. Again, note that only a portion of the semiconductor material is shown. For example, additional protective barriers can extend to the right along a NAND string which is subsequently formed.

Figure 10:
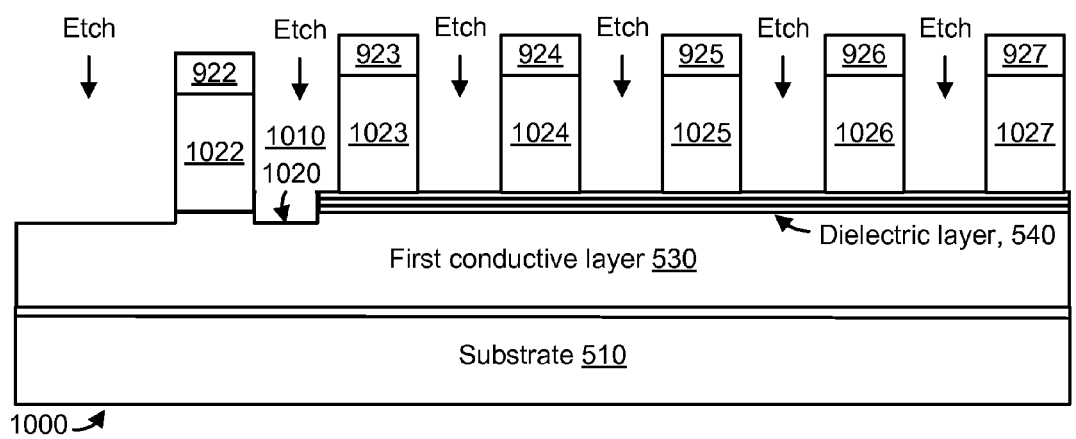

FIG. 10 depicts the semiconductor material of FIG. 9 after removal of portions of the second conductive layer, resulting in the semiconductor material 1000. The mask 910 is removed and an etch process is performed to remove portions of the second conductive layer which are not protected by the protective barriers. As a result, second conductive layer portions 1022, 1023, 1024, 1025, 1026 and 1027 remain after etching. Additionally, portions of the first conductive layer are exposed adjacent to the second conductive layer portion 1022, and portions of the dielectric layer 540 are exposed between the second conductive layer portions 1023 and 1024, 1024 and 1025, 1025 and 1026 and 1026 and 1027. The etch removes a portion of the second conductive layer which is between, in a bit line direction, the protective barriers 922 and 923, thereby forming a gap 1010 and exposing a portion 1020 of the first conductive layer 430. The gap 1010 can have a width of, e.g., approximately 1-1.5 F (see FIG. 1) and can extend between second conductive layer portions 1022 and 1023 which remain. The etch is controlled to reach the first conductive layer 530 without removing all of the first conductive layer 530 in the gap 1010.

The protective barriers 922 and 923 are used to define a select gate structure. In one approach, analogous select gate structures may be used for both source and drain sides of a NAND string. Alternatively, a select gate structure can be provided at the source side while a conventional select gate transistor is provided at the drain side, or a select gate structure can be provided at the drain side while a conventional select gate transistor is provided at the source side.

In an alternative approach, a mask is applied over a region between the first protective barrier 922 and the second protective barrier 923 when a first etch is performed. Then, the mask is removed and another mask is placed which has an opening between the protective barriers 922 and 923. A separate etch is then performed to remove only the portion of the second conductive layer which is between the protective barriers 922 and 923. The end result is as shown in FIG. 10. This approach involves an additional step but allows the etch between the first protective barrier 922 and the second protective barrier 923 to be performed independently of the etch between the other protective barriers which define the storage elements.

Figure 11:
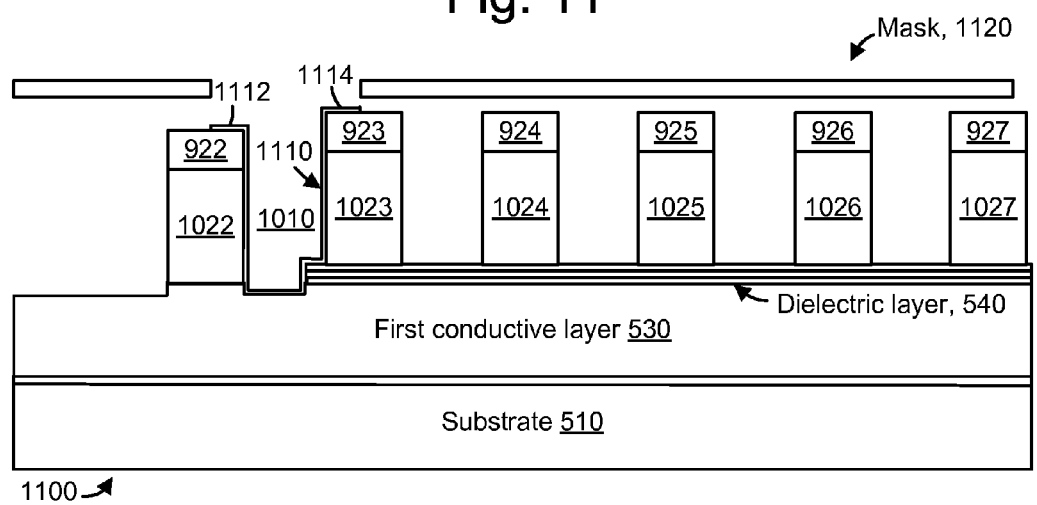

FIG. 11 depicts the semiconductor material of FIG. 10 after depositing a protective layer, resulting in the semiconductor material 1100. A protective layer 1110 which can be a dielectric material such as silicon nitride is applied in a region of the gap 1010 via a mask 1120. The protective layer 1110 can cover opposing side walls of the second conductive layer portions 1022 and 1023 and the exposed portion 1020 (FIG. 10) of the first conductive layer. Additionally, portions 1112 and 1114 of the protective layer can cover part of the top of the protective barriers 922 and 923, respectively, to allow for some misalignment in the application of the protective layer 1110.

Figure 12:
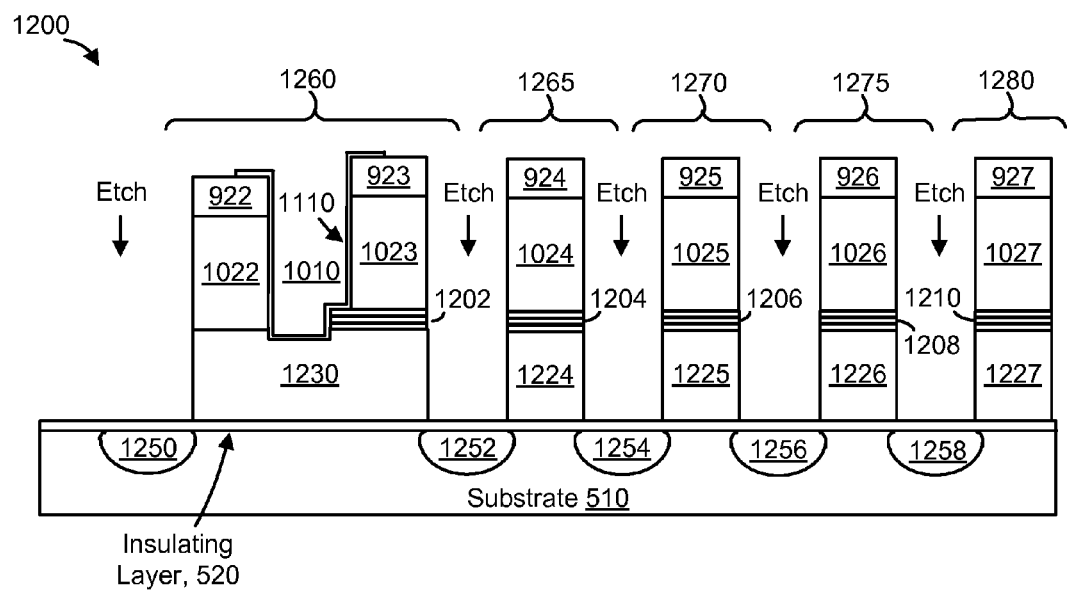

FIG. 12 depicts the semiconductor material of FIG. 11 after removing portions of the first conductive layer and dielectric layer, resulting in the semiconductor material 1200. In particular, a further etch process is performed to remove a portion of the first conductive layer which is adjacent to the second conductive layer portion 1022 and to remove portions of the dielectric layer 540 (FIG. 11) and the first conductive layer 530 which are between, in a bit line direction, the second conductive layer portions 1023 and 1024, 1024 and 1025, 1025 and 1026 and 1026 and 1027. As a result, dielectric layer portions 1202, 1204, 1206, 1208 and 1210 are defined, in addition to first conductive layer portions 1230, 1224, 1225, 1226 and 1227. The protective layer 1110 prevents etching in the gap 1010.

The semiconductor material 1200 includes a select gate structure 1260 and example non-volatile storage elements 1265, 1270, 1275 and 1280 which extend in a bit line or NAND string direction. The select gate structure and example non-volatile storage elements can be repeated across the substrate in a direction which is perpendicular to the page, e.g., a word line direction, as well as in the bit line direction. As mentioned, only a portion of a NAND string is shown. In practice, a NAND string includes select gates on either side of a series of non-volatile storage elements. The select gate structure 1260 depicted can be provided on the source side and/or a drain side of a NAND string. The select gate structure 1260 can have a width of about 3 F, where the second conductive layer portions 1022 and 1023 have approximately the same width, e.g., F. In another option, the select gate structure 1260 can have a width of about 3.5 F, where the second conductive layer portion 1022 has a width of approximately 1.5 F and the second conductive layer portion 1023 has a width of approximately F. In one approach, each non-volatile storage element has a width of approximately F, and the non-volatile storage elements are spaced apart from one another in the bit line direction by F (see FIG. 1).

Source/drain regions 1250 and 1252 are formed in the substrate 510 on either side of the select gate structure 1260. Additionally, example source/drain regions 1254, 1256 and 1258 are formed in regions of the substrate 510 which are between, in a bit line direction, the non-volatile storage elements. The select gate structure 1260 includes a first conductive layer portion 1230 which extends between, in a bit line direction, the source/drain regions 1250 and 1252. On one side of the select gate structure 1260, the second conductive layer portion 1022 is formed on, and is electrically coupled to the first conductive layer portion 1230. A select transistor is thereby formed having a select gate provided by the second conductive layer portion 1022 and first conductive layer portion 1230 and source/drain regions 1250 and 1252. A voltage applied to the select gate controls a current flow between the source/drain regions 1250 and 1252.

On part of the first conductive layer portion 1230, the dielectric layer portion 1202 is formed for electrically insulating the second conductive layer portion 1023 from the first conductive layer portion 1230. The second conductive layer portion 1023 serves as a coupling electrode, e.g., for reducing program disturb during programming. Additionally, in the storage elements, dielectric portions 1204, 1206, 1208 and 1210 electrically insulate first conductive layer portions 1224, 1225, 1226 and 1227, which serve as floating gates, from the second conductive layer portions 1024, 1025, 1026 and 1027, respectively, which serves as control gates.

Figure 13:
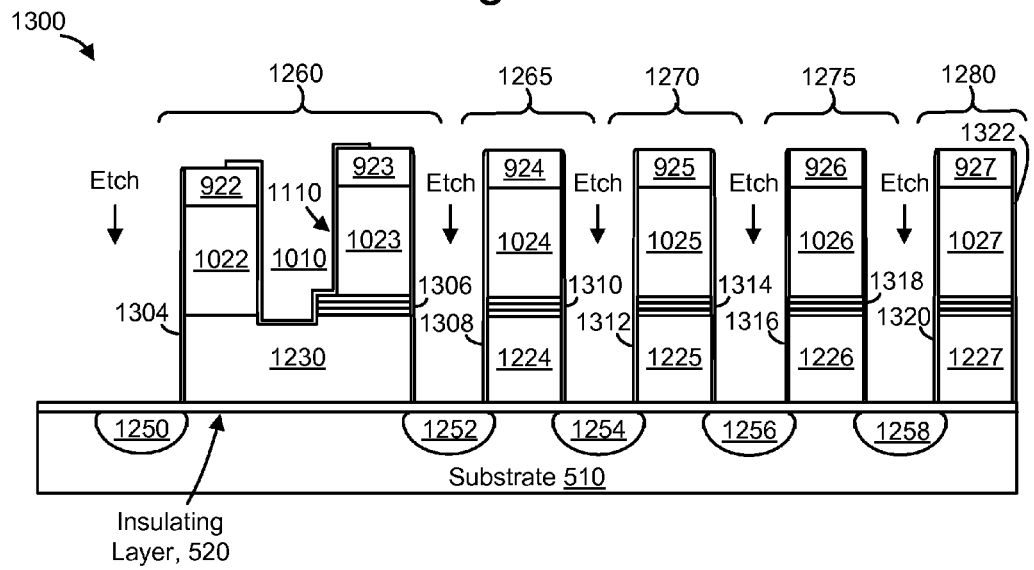

FIG. 13 depicts the semiconductor material of FIG. 12 after forming sidewall spacers. Spacers can be provided to prevent the bottom of the select gate structure, and the bottoms of the floating gates of the storage elements, from being rounded by oxidation. Spacers can be created by isotropically depositing the material that is to form the spacer, and then anisotropically etching the material away, leaving only the naturally tapered spacers on the sidewalls of the preexisting structures. In one embodiment, the spacers are made of SiN; however, other materials can also be used. In particular, spacers 1304, 1306, 1308, 1310, 1312, 1314, 1316, 1318, 1320 and 1322 can be provided along the sides of the select gate structure 1260 and storage elements 1265, 1270, 1275 and 1280. The spacers can be of varying heights. In the example shown, the spacers extend from the protective regions 922, 923, 924, 925, 926 and 927 to the insulating layer 520.

Figure 14:
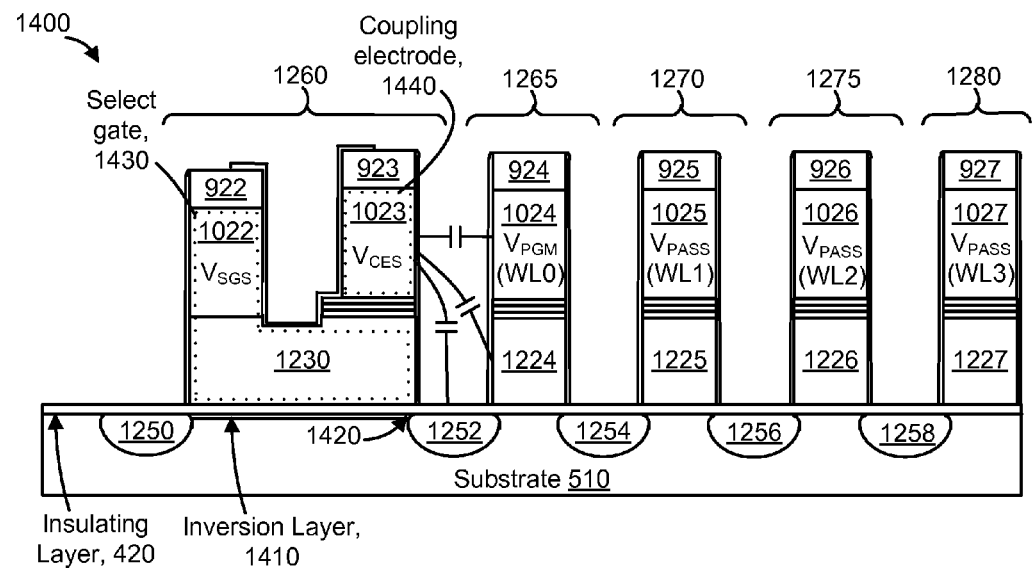

FIG. 14 depicts programming of the semiconductor material of FIG. 13 including voltages applied to the select gate and coupling electrode of the select gate structure, and coupling of voltage from the coupling electrode. Control lines can be formed to allow voltages to be independently applied to a select gate 1430, which is formed by the second conductive layer portion 1022 and the first conductive layer portion 1230, and a coupling electrode 1440, which is formed by the second conductive layer portion 1023. A sufficiently high voltage applied to the select gate 1430 results in an inversion layer 1410 which opens the select gate transistor, allowing current to flow between the source/drain regions 1250 and 1252. Moreover, the coupling electrode can provide a number of advantages during the programming process. For example, a voltage applied to the coupling electrode 1440 can influence a current flow in the substrate.

In particular, GIDL (Gate Induced Drain Lowering) program disturb has become an increasing important issue with further scaling of NAND technology. GIDL typically occurs at the maximum curvature point 1420 of the junction between the source drain region 1252 and the insulating layer 520. This type of program disturb particularly affects non-volatile storage elements which are programmed by word line 0 (WL0), the word line adjacent to the source side select gate in a NAND string. For example, if the select gate structure 1260 is on the source side, WL0, WL1, WL2 and WL3 can extend as control gates 1024, 1025, 1026 and 1027, respectively, where WL0 is an end word line which is adjacent to the select gate structure 1260. The program disturb is present to a lesser extent with the word line adjacent to the drain side select gate in a NAND string. WL0 program disturb mostly occurs during programming of WL0 itself when high programming voltage ($V_{PGM}$) values are reached and band-to-band tunneling exacerbated by a grounded WL occurs. To address this issue, it has been proposed to increase the spacing between end word lines and their corresponding select gates. Another proposed approach is to use dummy word lines and to either have no data on them or to have binary data on them. Another approach involves storing one or two bits per storage element for the non-volatile storage elements which are programmed by the end word lines while three bits are stored on each of the other non-volatile storage elements.

The select gate structure 1260 provided herein advantageously can reduce program disturb through appropriate control of the select gate and coupling electrode. The structure can be used in combination with other techniques for reducing program disturb. In particular, a voltage applied to the coupling electrode 1440 will be capacitively coupled to the control gate 1024 and floating gate 1224 of the adjacent non-volatile storage element 1265, in addition to the adjacent source/drain region 1252. This voltage can help reduce the production of hot electrons under the select gate structure where GIDL occurs. In particular, the depletion condition is changed, allowing for more scattering events along the path of the hot electrons which travel from where GIDL is occurring, at point 1420, to the floating gates of the non-volatile storage elements associated with the end word lines, e.g., floating gate 1224. This increase in scattering events can attract electrons away from the floating gates of the adjacent non-volatile storage elements by diverting them up to the positively biased coupling electrode 1440, thereby reducing the disturb phenomena. Additionally, electron surface scattering is increased due to an increase in the vertical field in the source/drain region 1252.

For example, during programming, $V_{SGS}$ is applied to the select gate 1430, $V_{CES}$ is applied to the coupling electrode 1440, a program voltage $V_{PGM}$ is applied to the selected word line, which is WL0 in the example, and pass voltages $V_{PASS}$ are applied to the remaining word lines, WL1-WL3. For example, up to 8 V or more can be placed on the coupling electrode 1440 depending on the voltage level that the dielectric layer portion 1202 (FIG. 12) beneath the coupling electrode 1440 can withstand. Moreover, the voltage can be applied to drive the coupling electrode 1440 during programming of the non-volatile storage elements via an end word line. This creates a stronger charge scattering by producing a stronger accumulation layer. More electrons can be diverted toward the coupling electrode 1440 and away from the floating gates of the adjacent non-volatile storage elements. Further, the high voltage applied to the coupling electrode 1440 can reduce the maximum programming voltage ($V_{PGM}$) needed to program the non-volatile storage elements associated with the end word lines, e.g., from 22 V to 21 V, by coupling voltage from the coupling electrode 1440 to the non-volatile storage elements of the end word lines. This coupled voltage acts in concert with $V_{PGM}$.

When non-volatile storage elements associated with other, non-adjacent word lines are programmed, the same voltage can be applied to the select gate 1430 and the coupling electrode 1440, e.g., 0 V. Other scenarios are possible as well. Thus, in one approach, the voltage of the coupling electrode 1440 can be set based on a position in a NAND string of the one or more non-volatile storage elements which are currently being programmed, or based on a position of the word line which is currently selected for programming among a set of word lines. In another possible approach, a voltage on the coupling electrode 1440 is allowed to float when an adjacent word line is used for programming. That is, the higher RC time constant of the select gate which results by the increased size of the select gate structure can be dealt with by floating the coupling electrode voltage and/or by simultaneously ramping or otherwise transitioning the voltage applied the select gate and the associated coupling electrode in the same polarity direction so that their mutual coupling will reinforce their charging or discharging.

Generally, the coupling electrode voltages be controlled based on various criterion including programming criterion such as the position of the selected word line, temperature, program pulse level or number, number of device cycles, and programming pass number when multi-pass programming is used.

Figure 15:
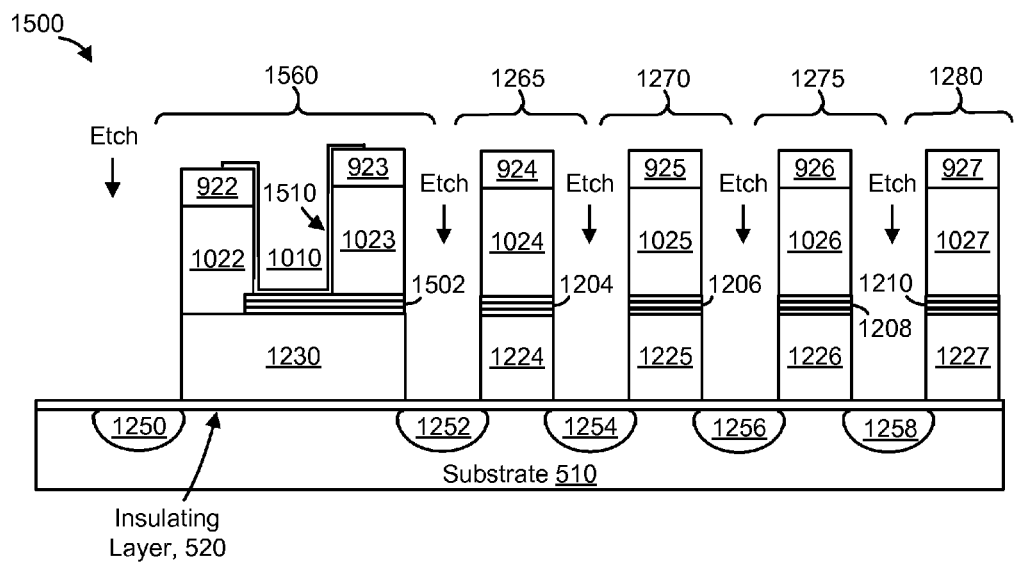
FIG. 15 depicts an alternative semiconductor material.

FIG. 15 depicts an alternative semiconductor material 1500 with an alternative select gate structure 1560. In this approach, the dielectric layer 1502 extends continuously between the second conductive layer portions 1022 and 1023 so that the first conductive layer is not exposed in the gap 1010. The protective layer 1510 is formed over a portion of the dielectric layer 1502 by analogy to the protective layer 1110 of FIG. 11. This design can be achieved by patterning the photo resist so that it extends further to the left relative to what is depicted for the photo resist 620 in FIG. 6. Moreover, part of the second conductive layer portion 1022 can be formed over the dielectric layer 1502 to account for misalignment.

Figure 16:
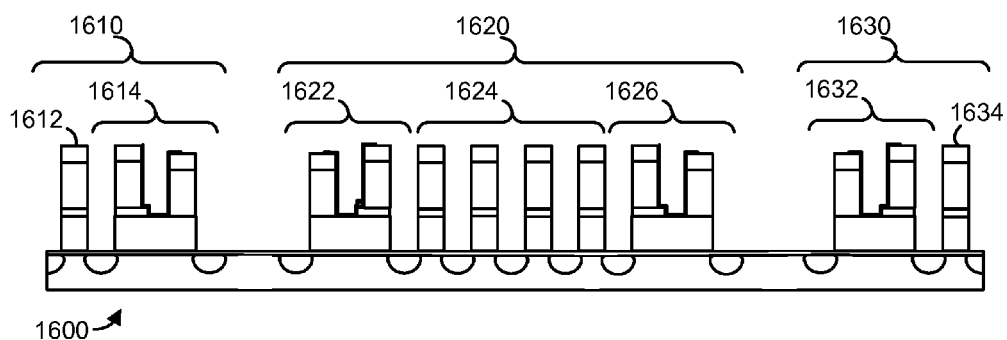
FIG. 16 depicts NAND strings which include the semiconductor material of FIG. 13.

FIG. 16 depicts NAND strings which include the semiconductor material of FIG. 13. A non-volatile storage system typically includes a number of NAND strings arranged end to end and side by side. The arrangement 1600 depicts a complete NAND string 1620 arranged end to end, with partial NAND strings 1610 and 1630. In particular, the complete NAND string 1620 includes a source side select gate structure 1622, a series of non-volatile storage elements 1624 and a drain side select gate structure 1626. On one side of the NAND string 1620, a portion of another NAND string 1630 includes a source side select gate structure 1632 and an example non-volatile storage element 1634. On the other side of the NAND string 1620, a portion of another NAND string 1610 includes a drain side select gate structure 1614 and an example non-volatile storage element 1612.

Figure 17A:
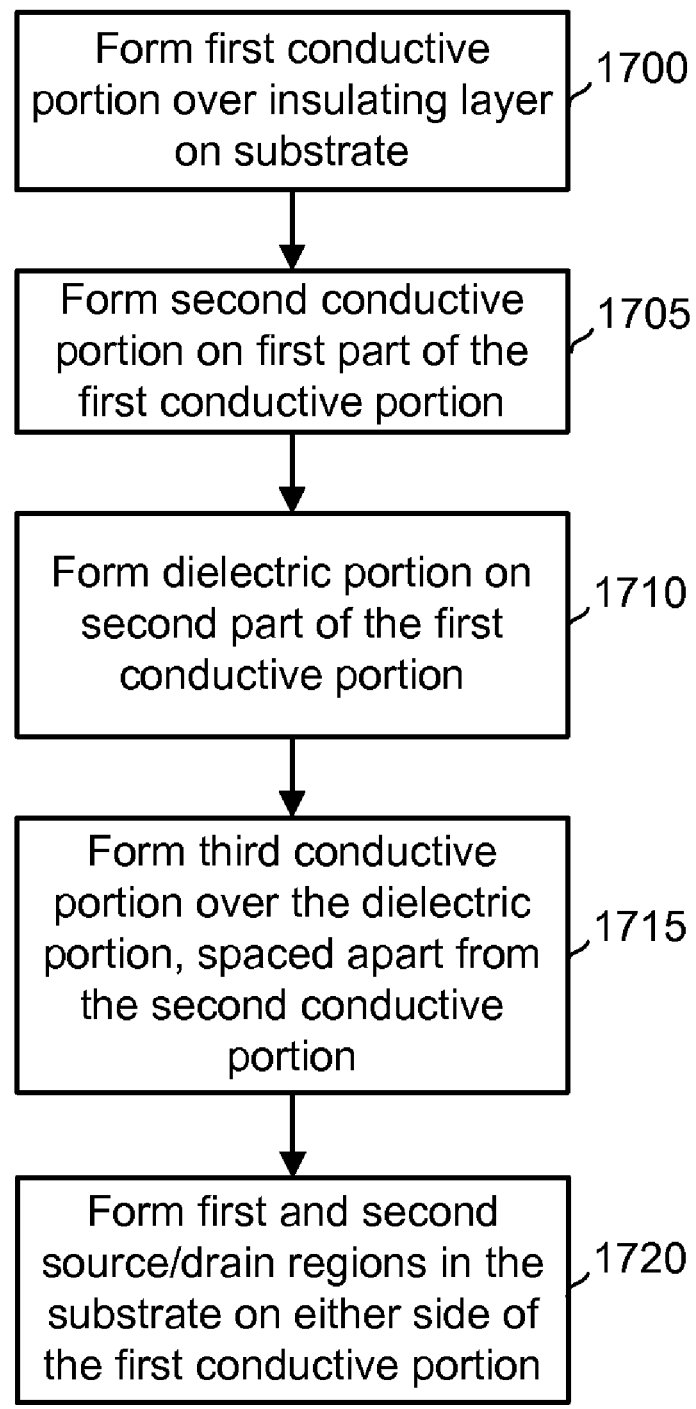
FIG. 17a depicts an overview of a process for fabricating semiconductor material with a select gate structure.

FIG. 17a depicts an overview of a process for fabricating semiconductor material with a select gate structure. The process shown is an example only as various processes can be used in practice. Referring also to FIGS. 5-14, at step 1700, a first conductive portion (e.g., portion 1230) is formed over an insulating layer (e.g., layer 520) of a substrate (e.g., substrate 510). At step 1705, a second conductive portion (e.g., portion 1022) is formed on a first part of the first conductive portion. At step 1710, a dielectric portion (e.g., portion 1202) is formed on a second part of the first conductive portion. At step 1715, a third conductive portion (e.g., portion 1023) is formed over the dielectric portion, spaced apart from the second conductive portion. At step 1720, first and second source/drain regions (e.g., regions 1250 and 1252) are formed in the substrate on either side of the first conductive portion (1230). These are the source/drain regions for the select gate (1430).

Figure 17B:
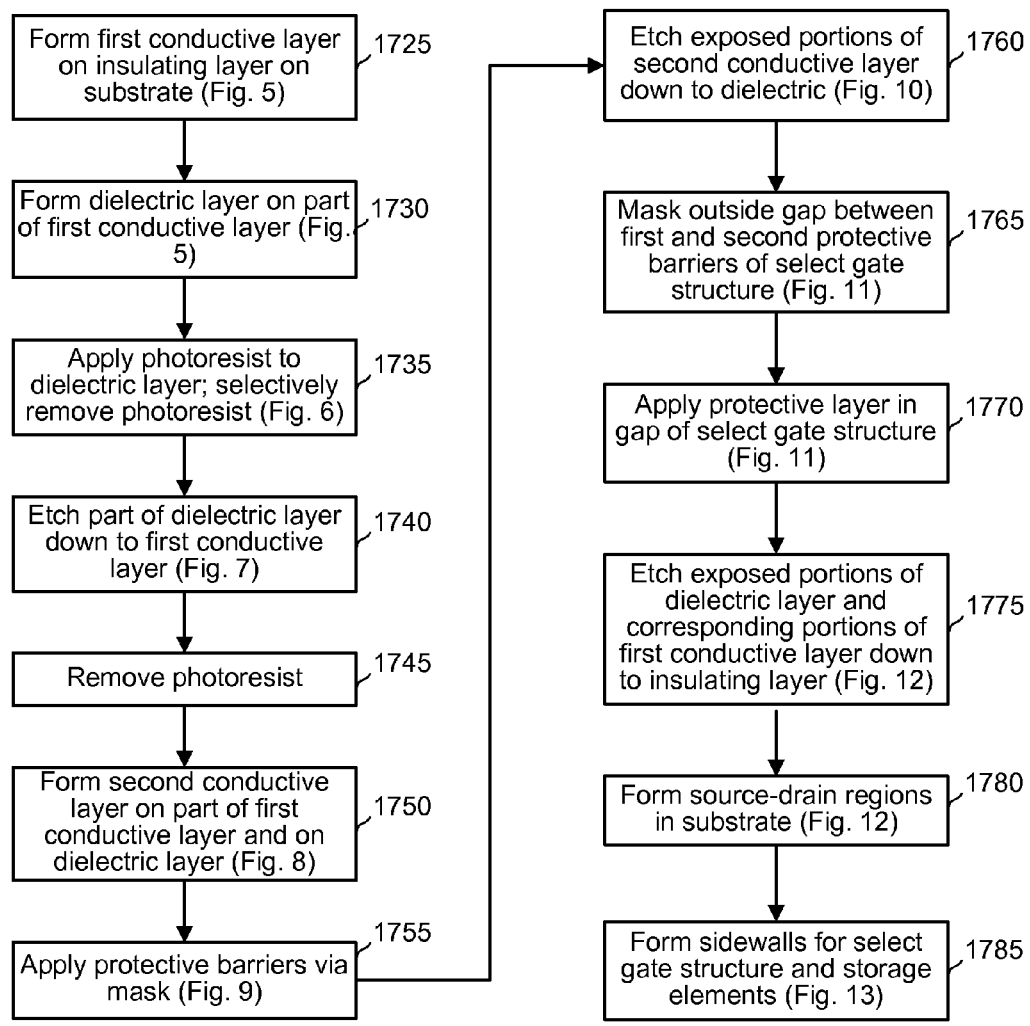
FIG. 17b depicts a detailed process for fabricating the semiconductor material of FIG. 13.

FIG. 17b depicts a detailed process for fabricating the semiconductor material of FIG. 13. The process shown is an example only as various processes can be used in practice. At step 1725, a first conductive layer is formed on an insulating layer on a substrate (see, e.g., FIG. 5). At step 1730 a dielectric layer is formed on part of the first conductive layer (see, e.g., FIG. 5). As mentioned, the dielectric layer may be formed on a desired region of the first conductive layer, e.g., using an appropriate masking technique, or the dielectric layer may be formed over all of the first conductive layer and selectively removed to expose a desired portion of the first conductive layer. At step 1735, a photo resist is applied to the dielectric layer (see, e.g., FIG. 6). At step 1740, portions of the dielectric layer are etched down to the first conductive layer (see, e.g., FIG. 7). Next, at step 1745, the photo resist is removed. At step 1750, the second conductive layer is formed on the exposed part of the first conductive layer and on the remaining part of the dielectric layer (see, e.g., FIG. 8). At step 1755, the protective barriers are applied using a mask (see, e.g., FIG. 9). At step 1760, the exposed portions of the second conductive layer are etched down to the dielectric layer or to the first conductive layer (see, e.g., FIG. 10). At step 1765, a mask is provided outside the gap between the first and second protective barriers of the select gate structure (see, e.g., FIG. 11). At step 1770, a protective layer is applied in the gap of the select gate structure (see, e.g., FIG. 11). At step 1775, exposed portions of the dielectric layer and corresponding portions of the first conductive layer are etched down to the insulating layer (see, e.g., FIG. 12). At step 1780, source/drain regions are formed in the substrate adjacent to the select gate structure and the non-volatile storage elements (see, e.g., FIG. 12). Finally, at step 1785, side walls are formed on the select gate structure and the storage elements (see, e.g., FIG. 12).

Figure 18A:
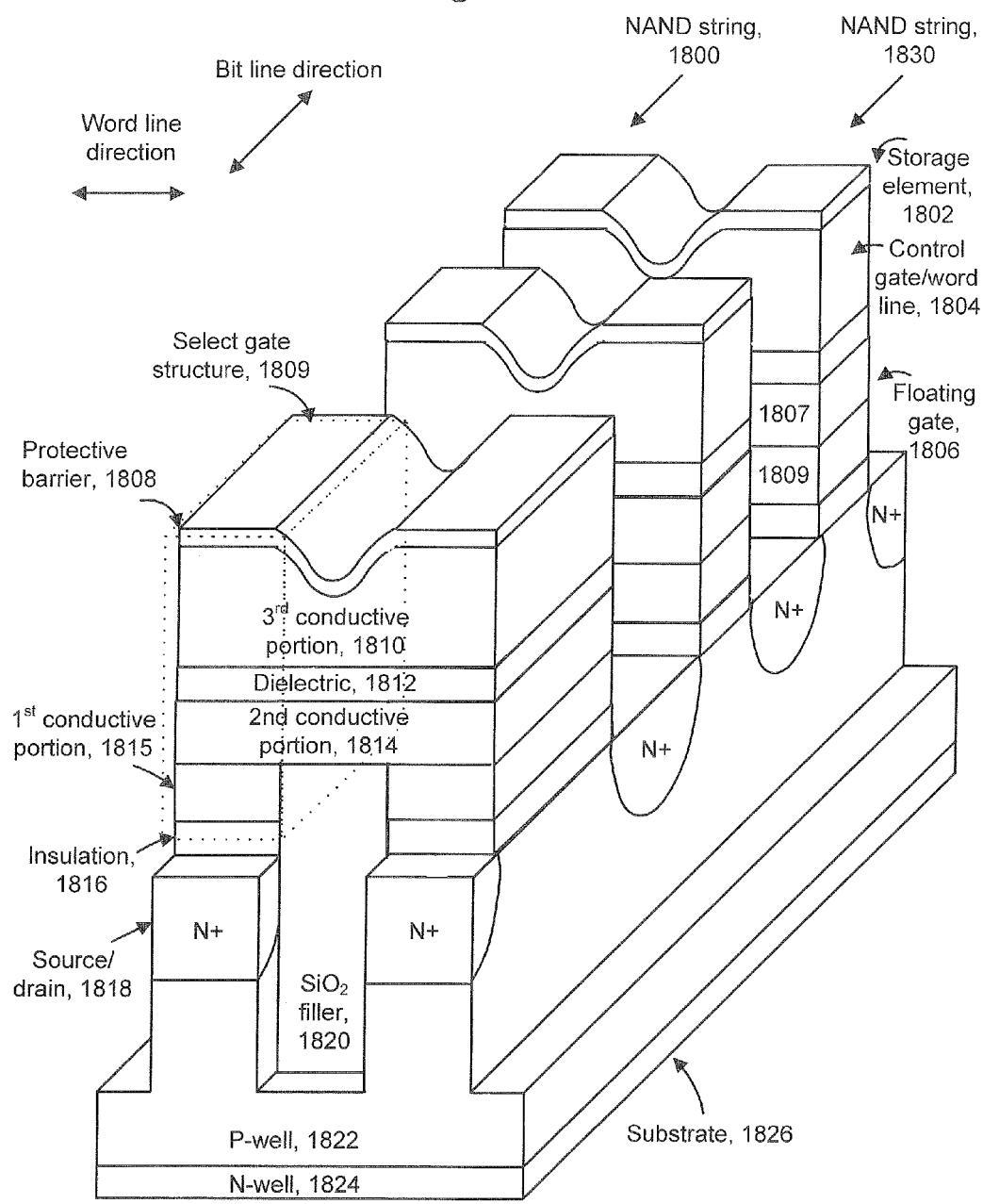

FIGS. 18a-18i relate to another embodiment of NAND strings with dual voltage select gate structures. In particular, FIG. 18a depicts another embodiment of NAND strings with dual voltage select gate structures. In this embodiment, a select gate structure 1809 includes a first conductive portion 1815 formed on an insulation portion 1816, and a second conductive portion 1814 formed on the first conductive portion. The first conductive portions of each NAND string are spaced apart in a word line direction. Further, the second conductive portion 1814 extends continuously in a word line direction across multiple NAND strings, whereas the first conductive portion is isolated between NAND strings, e.g., NAND strings 1800 and 1830. A third conductive portion 1810 is formed on a dielectric 1812 and also extends continuously in a word line direction across multiple NAND strings. A protective barrier 1808 is provided on the third conductive portion 1810. A filler 1820, such as $SiO_2$, extends between the first conductive portion of each NAND string.

Example storage element 1802 includes a control gate/word line 1804 and a floating gate 1806 which includes the first conductive portion 1809 and the second conductive portion 1807. The NAND strings 1800 and 1830 are formed on a substrate 1826 which includes a p-well 1822 and an n-well 1824. An example source/drain region 1818 is also depicted.

FIG. 18*b* depicts a perspective view of storage elements of the NAND string of FIG. 18*a*. This view does not include the select gate structure so that the storage elements can be seen more clearly. For instance, components of the storage element 1831 which can be seen include the protective barrier 1832, the third conductive portion 1834, dielectric 1836, second conductive portion 1838, first conductive portion 1839 and insulation 1840. Here, the second conductive portions are spaced apart in the word line direction rather than being continuous as in the select gate structure.

Figure 18E:
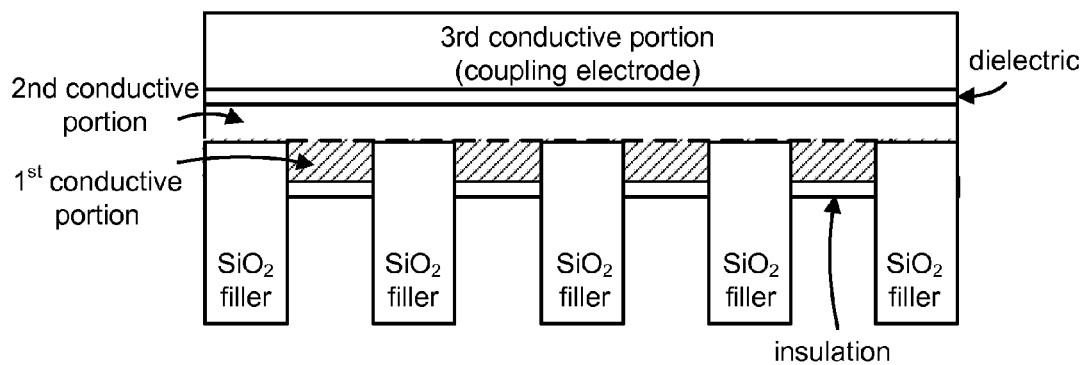
Figure 18F:
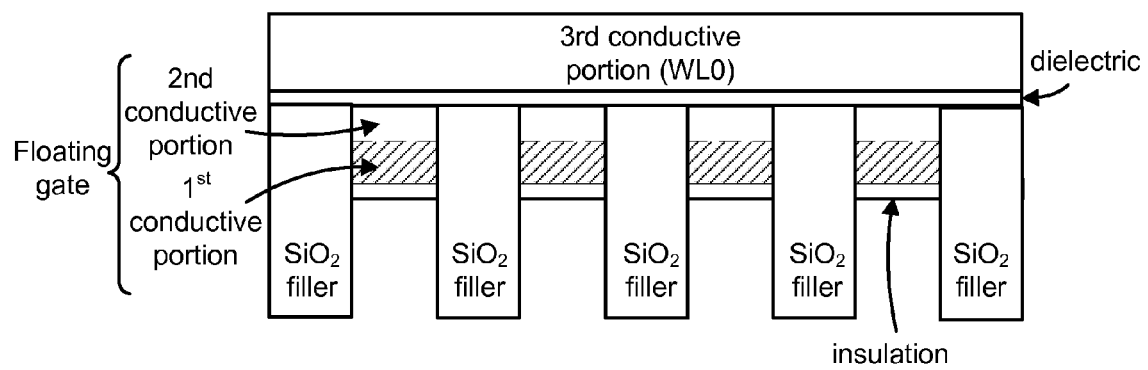

FIG. 18*c* depicts an arrangement of a select gate structure with respect to NAND strings and word lines. Example word lines WL0-WL3 and NAND strings, including example NAND string 1850, are depicted. A region 1841 indicates where the select gate structures are provided. Cross-sectional views along the NAND string 1850, select gate structure region 1841 and WL0 are depicted in FIGS. 18*d-f*, respectively.

FIG. 18*d* depicts a cross-sectional view along a NAND string of the arrangement of FIG. 18*c*. The example NAND string 1850 includes a select gate structure 1851 and storage elements 1852, 1853, 1854 and 1855. The select gate structure 1851 includes a first conductive portion 1861 which is formed on an insulating layer 1878 of a substrate 1885. A second conductive portion 1860 is provided on the first conductive portion. The first and second conductive portions 1861 and 1860 together make up a select gate 1857. A dielectric portion 1849 insulates the first and second conductive portions from the third conductive portion 1859, which provides a coupling electrode 1856. A protective portion 1858 is provided on the third conductive portion 1859.

Each storage element includes a floating gate which is made up of first and second conductive portions. See, e.g., first and second conductive portions 1865 and 1864, respectively, for storage element 1852, first and second conductive portions 1869 and 1868, respectively, for storage element 1853, first and second conductive portions 1873 and 1872, respectively, for storage element 1854, and first and second conductive portions 1877 and 1876, respectively, for storage element 1855. Each storage element further includes a control gate/word line portion which is insulated from the respective floating gate by a respective dielectric portion. See, e.g., control gate/word line portions 1863, 1867, 1871 and 1875 for storage elements 1852, 1853, 1854 and 1855, respectively. Protective regions 1862, 1866, 1870 and 1874 are also provided for storage elements 1852, 1853, 1854 and 1855, respectively. Further, in the substrate 1885, source/drain regions 1880, 1881, 1882, 1883 and 1884 are formed.

In operation, when a sufficiently high voltage $V_{SGS}$ is applied to the select gate 1857, an inversion layer 1879 is formed in the substrate 1885, allowing current to flow. Further, a voltage $V_{CES}$ which is applied to the coupling electrode 1856 is coupled to the control gate 1863 and floating gate (portions 1864 and 1865) of storage element 1852, and to the source/drain region 1881, as discussed in connection with FIG. 14. As mentioned, the select gate structure 1851 can provide benefits such as reduced GIDL. Specifically, coupling, e.g., fringing, between the coupling electrode 1856 and the floating gate of storage element 1852 can allow a lower value of $V_{PGM}$ to be used on WL0 during programming.

Further, the coupling electrode 1856 can interact with the floating gate of storage element 1852 during a read/verify process. For example, consider storage element 1854 which is spaced apart from the coupling electrode 1856. When storage element 1854 is read, a sense voltage in the range of about 0-4 V is applied to the control gate 1871, while a read voltage of about 5-6 V is applied to the control gates 1863, 1867 and 1875 of the other storage elements in the NAND string. The read voltage is just enough to turn the storage elements 1852, 1853 and 1855 on. Further, the floating gate (conductive portions 1872 and 1873) of storage element 1854 will receive a coupling effect from the neighboring control gates 1867 and 1875. However, when an end storage element is read, there is conventionally coupling only from one storage element, so the sense voltage may be set higher. In contrast, with the use of a select gate structure having a coupling electrode as provided herein, the end storage element 1852 again receives coupling from both sides. For example, about 4-8 V can be applied to the coupling electrode 1856 and the sense voltage can be compensated accordingly.

FIG. 18*e* depicts a cross-sectional view along a select gate structure of the arrangement of FIG. 18*c*. The select gate structure includes a third conductive portion (which provides a coupling electrode), a dielectric layer, and second conductive portion which extends continuously in the word line direction. A first conductive portion and insulation portion are provided for each NAND string, and isolated in the word line direction by a filler such as $SIO_2$. The third conductive portion provides a common coupling electrode for multiple NAND strings, while the second conductive portion, together with the first conductive portions, provides a select gate for each NAND string. The first and second conductive portions can be provided as two separately deposited polysilicon layers. In one approach, the first conductive portion is deposited, then a shallow trench isolation (STI) etch is performed in which the first conductive portion is etched into strips which extend along the NAND strings. The second conductive layer is then deposited and also etched in the bit line direction. Then, the dielectric layer and the third conductive portion are deposited, and the first, second and third conductive portions and the dielectric layer are etched in the word line direction to provide separate portions which form respective parts of the floating gates of the storage elements. The mask used for etching the second conductive layer in the bit line direction should be designed so that it leaves the second conductive layer as a continuous layer in the word line direction in a region of the select gate structure.

FIG. 18*f* depicts a cross-sectional view along a word line of the arrangement of FIG. 18*c*. Here, individual floating gates are comprised of the first and second conductive portions in each NAND string which have been separated in the word line direction and bit line direction, as discussed. The third conductive layer provides WL0.

Figure 18G:
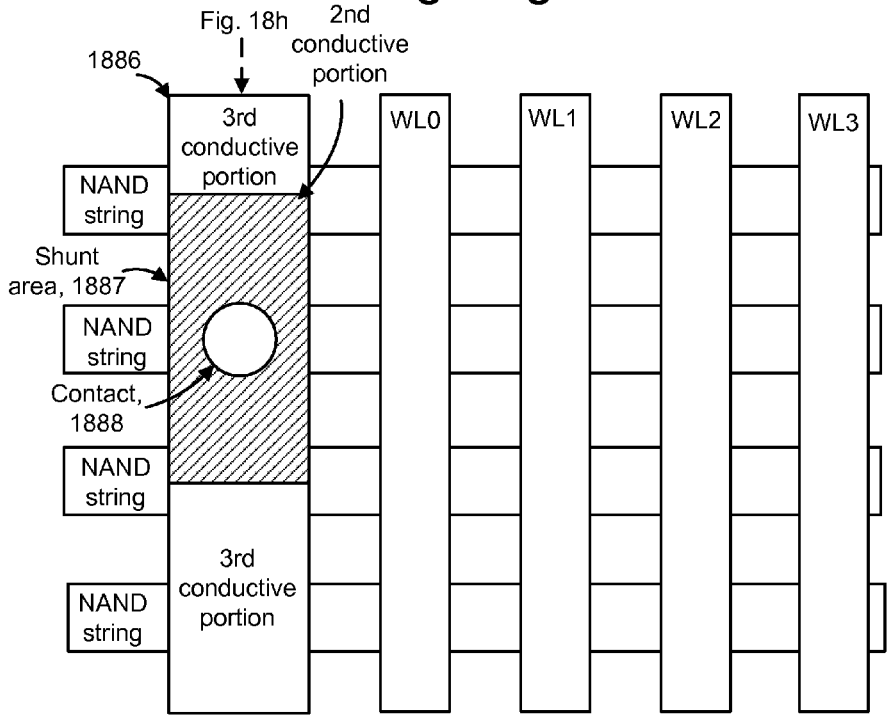
Figure 18H:
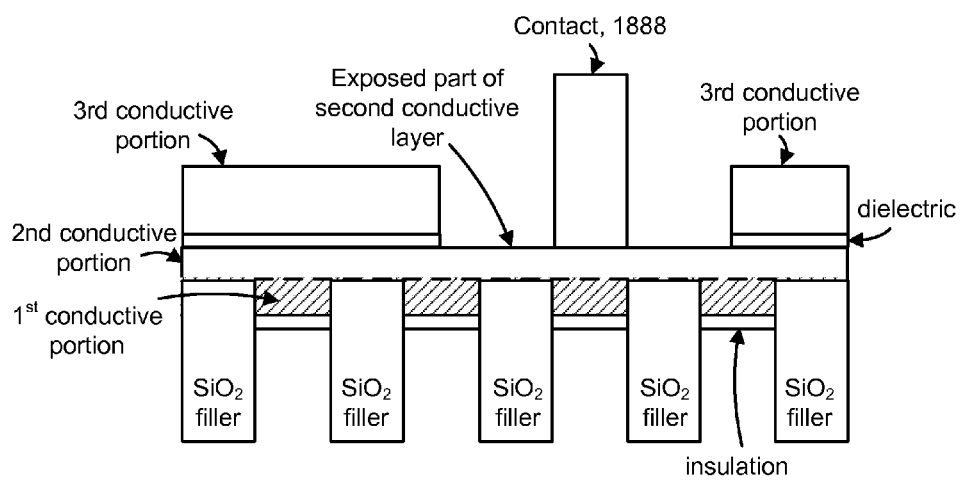

FIG. 18*g* depicts an arrangement of a select gate structure 1886 with respect to NAND strings and word lines, showing a shunt area 1887 and a contact 1888. The select gate voltage $V_{SGS}$ can be coupled to the select gates in different ways. In one approach, a shunt area is formed by etching through the third conductive portion and the dielectric in the select gate structure region, thereby exposing part of the second conductive portion. The shunt area can be a dummy storage element array area. See also FIG. 18h, which depicts a cross-sectional view along a select gate structure of the arrangement of FIG. 18g. A contact 1888 can then be formed on the exposed part of the second conductive layer and connected to a control line which provides $V_{SGS}$.

Figure 18I:
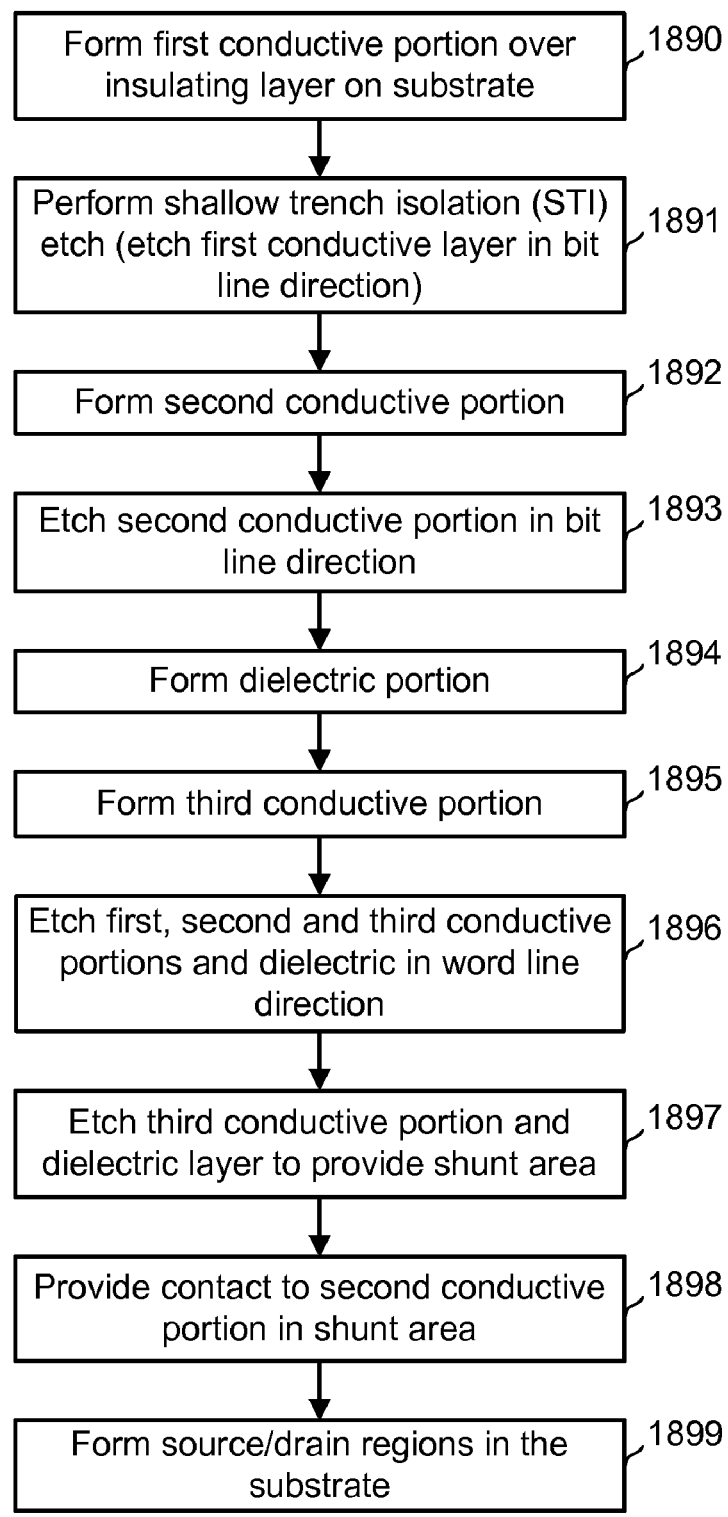

FIG. 18i depicts an overview of a process for fabricating an alternative embodiment of a semiconductor material with a select gate structure. Step 1890 includes forming a first conductive portion over an insulating layer on a substrate. Step 1891 includes performing a shallow trench isolation etch which etches the first conductive layer in the bit line, e.g., NAND string, direction. Step 1892 includes forming a second conductive portion. Step 1893 includes etching the second conductive portion in the bit line direction to provide strips of the second conductive portion over the existing strips of the first conductive portion. Step 1894 includes forming a dielectric portion over the existing structure, and step 1895 includes forming a third conductive portion over the existing structure. Step 1896 includes etching the first, second and third conductive portions and the dielectric portion in the word line direction. Step 1897 includes etching the third conductive portion in a region of the select gate structure to provide a shunt area. Step 1898 includes providing a contact to the second conductive layer in the shunt area. Step 1899 includes forming source/drain regions in the substrate.

The operation of a NAND string having a select gate structure as discussed above can be understood further in view of the following.

Figure 2:
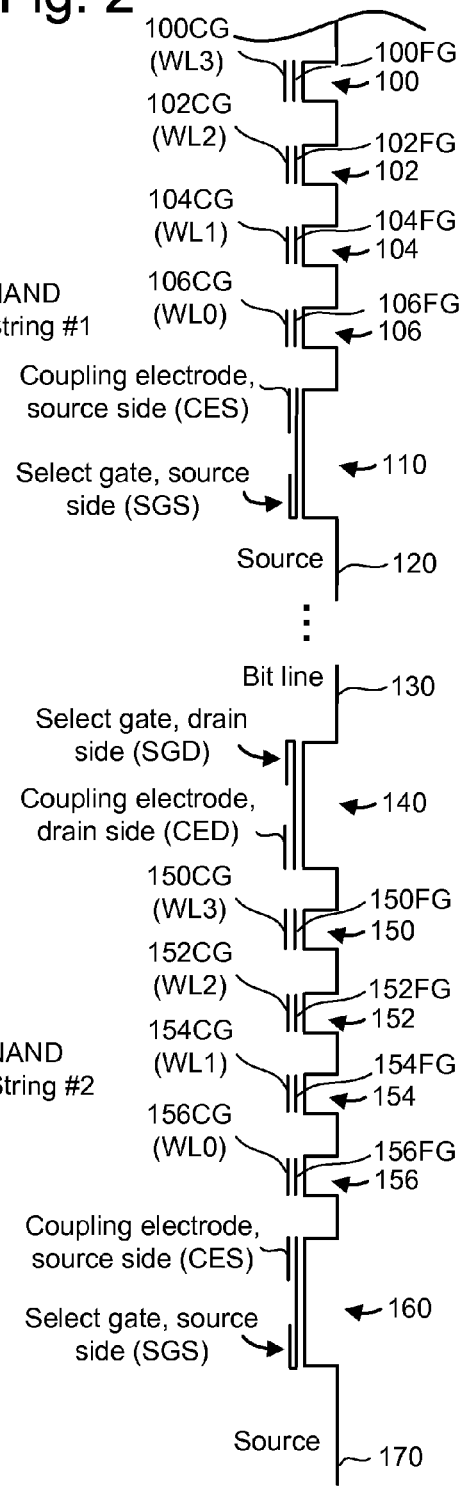
FIG. 2 is an equivalent circuit diagram of the NAND strings of FIG. 1.
Figure 19:
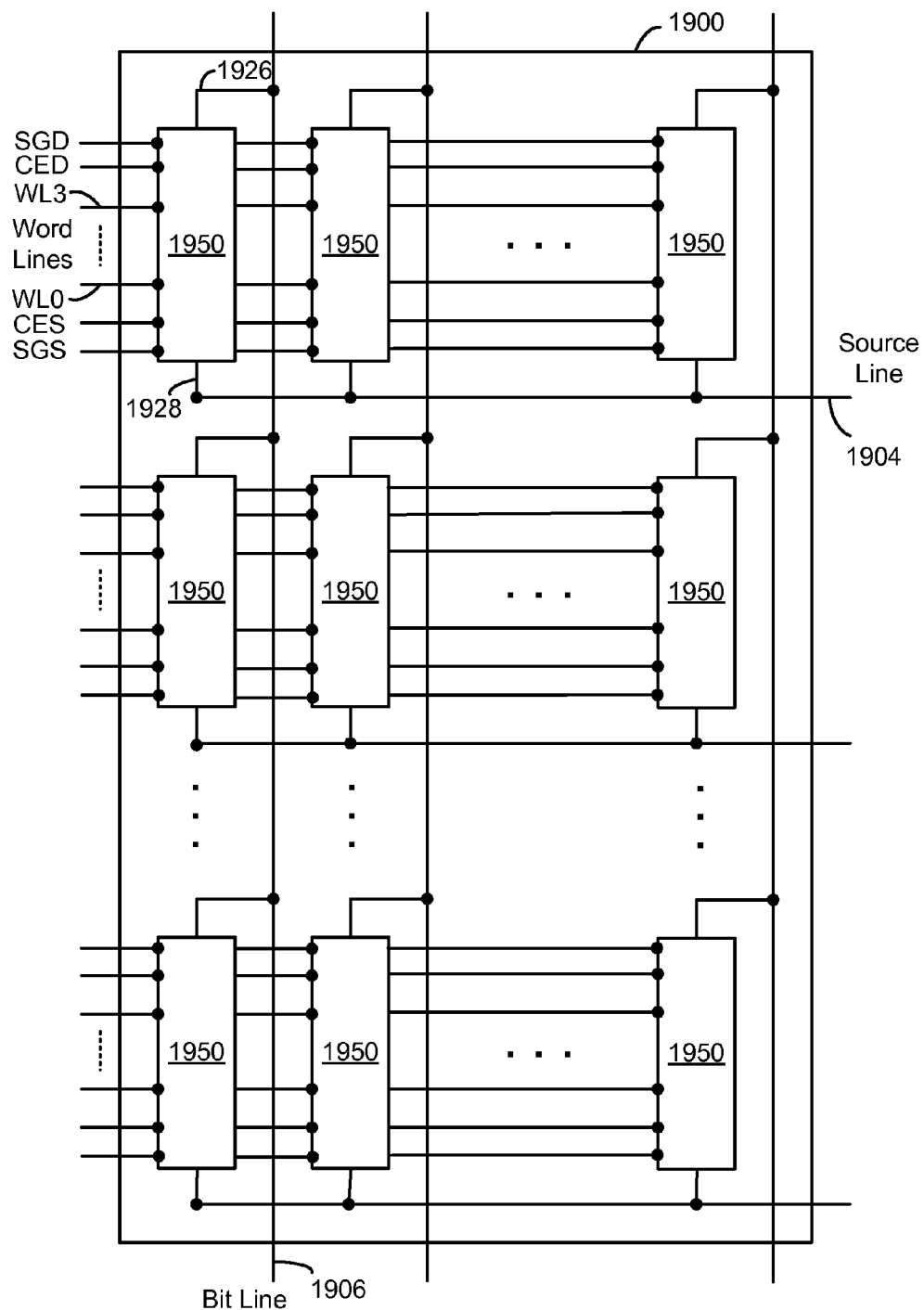
FIG. 19 is a block diagram of an array of NAND flash storage elements.

FIG. 19 illustrates an example of an array 1900 of NAND storage elements, such as those shown in FIGS. 1-3. Along each column, a bit line 1906 is coupled to the drain terminal 1926 of the drain select gate for the NAND string 1950. Along each row of NAND strings, a source line 1904 may connect all the source terminals 1928 of the source select gates of the NAND strings. An example of a NAND architecture array and its operation as part of a memory system is found in U.S. Pat. Nos. 5,570,315; 5,774,397; and 6,046,935.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is a unit of programming. In one embodiment, the individual pages may be divided into segments and the segments may contain the fewest number of storage elements that are written at one time as a basic programming operation. One or more pages of data are typically stored in one row of storage elements. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory storage elements are erased in one embodiment by raising the p-well to an erase voltage (e.g., 20 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the threshold voltage of a selected storage element is lowered. Erasing can be performed on the entire memory array, separate blocks, or another unit of storage elements.

Figure 20:
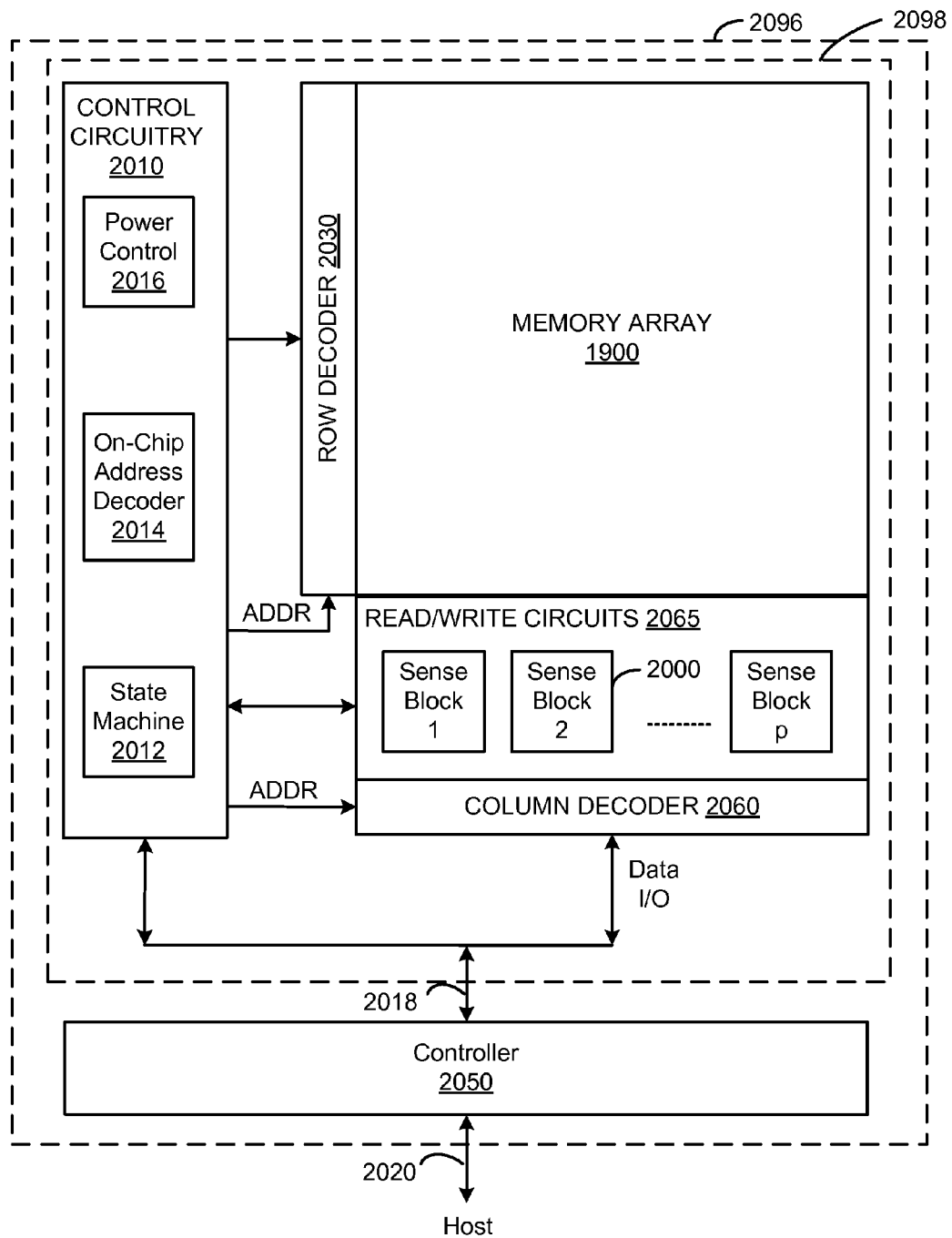
FIG. 20 is a block diagram of a non-volatile memory system using single row/column decoders and read/write circuits.

FIG. 20 is a block diagram of a non-volatile memory system using single row/column decoders and read/write circuits. The memory device 2096 has read/write circuits for reading and programming a page of storage elements in parallel, according to one embodiment of the present invention. Memory device 2096 may include one or more memory die 2098. Memory die 2098 includes a two-dimensional array of storage elements 1900, control circuitry 2010, and read/write circuits 2065. In some embodiments, the array of storage elements can be three dimensional. The memory array 1900 is addressable by word lines via a row decoder 2030 and by bit lines via a column decoder 2060. The read/write circuits 2065 include multiple sense blocks 2000 and allow a page of storage elements to be read or programmed in parallel. Typically a controller 2050 is included in the same memory device 2096 (e.g., a removable storage card) as the one or more memory die 2098. Commands and Data are transferred between the host and controller 2050 via lines 2020 and between the controller and the one or more memory die 2098 via lines 2018.

The control circuitry 2010 cooperates with the read/write circuits 2065 to perform memory operations on the memory array 1900. The control circuitry 2010 includes a state machine 2012, an on-chip address decoder 2014 and a power control module 2019. The state machine 2012 provides chip-level control of memory operations. The on-chip address decoder 2014 provides an address interface between that used by the host or a memory controller to the hardware address used by the decoders 2030 and 2060. The power control module 2016 controls the power and voltages supplied to the word lines and bit lines during memory operations.

In some implementations, some of the components can be combined. In various designs, one or more of the components of (alone or in combination), other than storage element array 1900, can be thought of as a managing circuit. For example, one or more managing circuits may include any one of or a combination of control circuitry 2010, state machine 2012, decoders 2014, 2030 and 2060, power control 2016, sense blocks 2000, read/write circuits 2065, controller 2050, etc.

Figure 21:
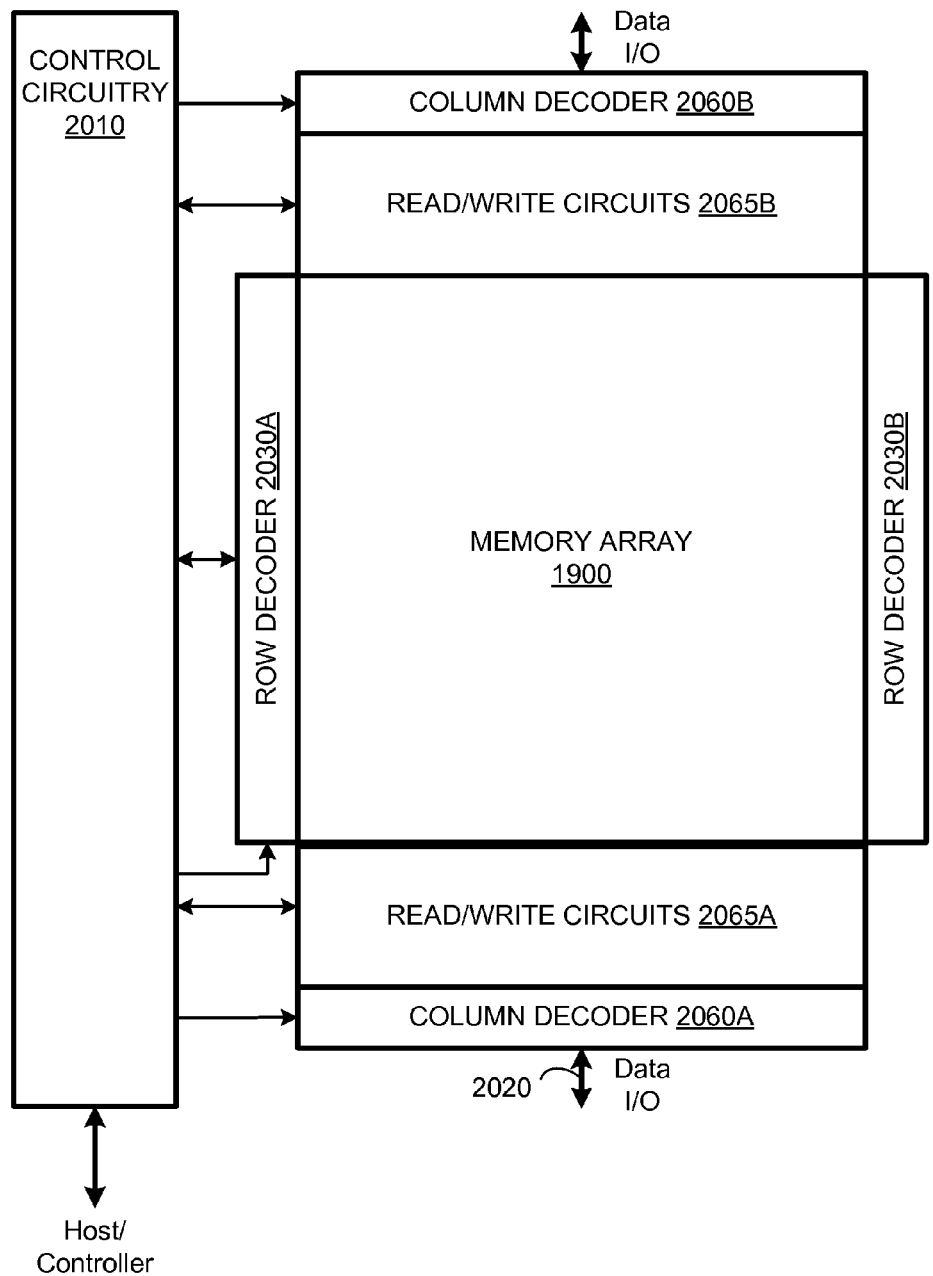
FIG. 21 is a block diagram of a non-volatile memory system using dual row/column decoders and read/write circuits.

FIG. 21 is a block diagram of a non-volatile memory system using dual row/column decoders and read/write circuits. Another arrangement of the memory device 2096 shown in FIG. 20 is provided. Here, access to the memory array 1900 by the various peripheral circuits is implemented in a symmetric fashion, on opposite sides of the array, so that the densities of access lines and circuitry on each side are reduced by half. Thus, the row decoder is split into row decoders 2030A and 2030B and the column decoder into column decoders 2060A and 2060B. Similarly, the read/write circuits are split into read/write circuits 2065A connecting to bit lines from the bottom and read/write circuits 2065B connecting to bit lines from the top of the array 1900. In this way, the density of the read/write modules is essentially reduced by one half. The device of FIG. 21 can also include a controller, as described above for the device of FIG. 20.

Figure 22:
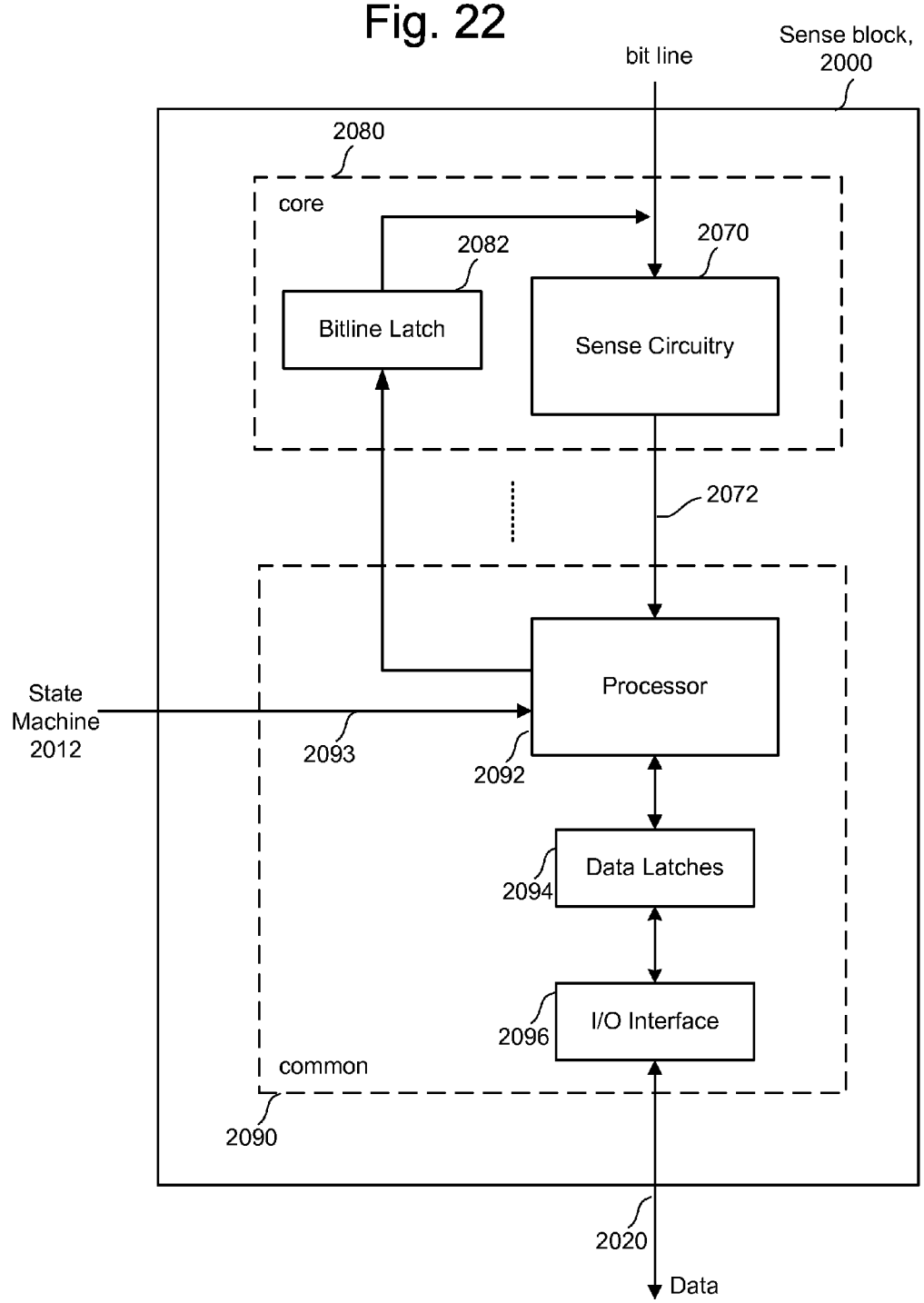
FIG. 22 is a block diagram depicting one embodiment of a sense block.

FIG. 22 is a block diagram of an individual sense block 2000 partitioned into a core portion, referred to as a sense module 2080, and a common portion 2090. In one embodiment, there will be a separate sense module 2080 for each bit line and one common portion 2090 for a set of multiple sense modules 2080. In one example, a sense block will include one common portion 2090 and eight sense modules 2080. Each of the sense modules in a group will communicate with the associated common portion via a data bus 2072. For further details refer to U.S. Patent Application Pub. No. 2006/0140007, title "Non-Volatile Memory & Method with Shared Processing for an Aggregate of Sense Amplifiers" published Jun. 29, 2006, incorporated herein by reference in its entirety.

Sense module 2080 comprises sense circuitry 2070 that determines whether a conduction current in a connected bit line is above or below a predetermined threshold level. Sense module 2080 also includes a bit line latch 2082 that is used to set a voltage condition on the connected bit line. For example, a predetermined state latched in bit latch 2082 will result in the connected bit line being pulled to a state designating program inhibit (e.g., $V_{DD}$).

Common portion 2090 comprises a processor 2092, a set of data latches 2094 and an I/O Interface 2096 coupled between the set of data latches 2094 and data bus 2020. Processor 2092 performs computations. For example, one of its functions is to determine the data stored in the sensed storage element and store the determined data in the set of data latches. The set of data latches 2094 is used to store data bits determined by processor 2092 during a read operation. It is also used to store data bits imported from the data bus 2020 during a program operation. The imported data bits represent write data meant to be programmed into the memory. I/O interface 2096 provides an interface between data latches 2094 and the data bus 2020.

During read or sensing, the operation of the system is under the control of state machine 2012 that controls the supply of different control gate voltages to the addressed storage element. As it steps through the various predefined control gate voltages corresponding to the various memory states supported by the memory, the sense module 2080 may trip at one of these voltages and an output will be provided from sense module 2080 to processor 2092 via bus 2072. At that point, processor 2092 determines the resultant memory state by consideration of the tripping event(s) of the sense module and the information about the applied control gate voltage from the state machine via input lines 2093. It then computes a binary encoding for the memory state and stores the resultant data bits into data latches 2094. In another embodiment of the core portion, bit line latch 2082 serves double duty, both as a latch for latching the output of the sense module 2080 and also as a bit line latch as described above.

It is anticipated that some implementations will include multiple processors 2092. In one embodiment, each processor 2092 will include an output line (not depicted in FIG. 19) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data zero (or a data one inverted), then the state machine knows to terminate the programming process. Because each processor communicates with eight sense modules, the state machine needs to read the wired-OR line eight times, or logic is added to processor 2092 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 2094 from the data bus 2020. The program operation, under the control of the state machine, comprises a series of programming voltage pulses applied to the control gates of the addressed storage elements. Each programming pulse is followed by a read back (verify) to determine if the storage element has been programmed to the desired memory state. Processor 2092 monitors the read back memory state relative to the desired memory state. When the two are in agreement, the processor 2092 sets the bit line latch 2082 so as to cause the bit line to be pulled to a state designating program inhibit. This inhibits the storage element coupled to the bit line from further programming even if programming pulses appear on its control gate. In other embodiments the processor initially loads the bit line latch 2082 and the sense circuitry sets it to an inhibit value during the verify process.

Data latch stack 2094 contains a stack of data latches corresponding to the sense module. In one embodiment, there are three data latches per sense module 2080. In some implementations (but not required), the data latches are implemented as a shift register so that the parallel data stored therein is converted to serial data for data bus 2020, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in: (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," filed on Dec. 16, 2004; (4) U.S. patent application Ser. No. 11/099,133, titled "Compensating for Coupling During Read Operations of Non-Volatile Memory," filed on Apr. 5, 2005; and (5) U.S. patent application Ser. No. 11/321,953, titled "Reference Sense Amplifier For Non-Volatile Memory, filed on Dec. 28, 2005. All five of the immediately above-listed patent documents are incorporated herein by reference in their entirety.

Figure 23:
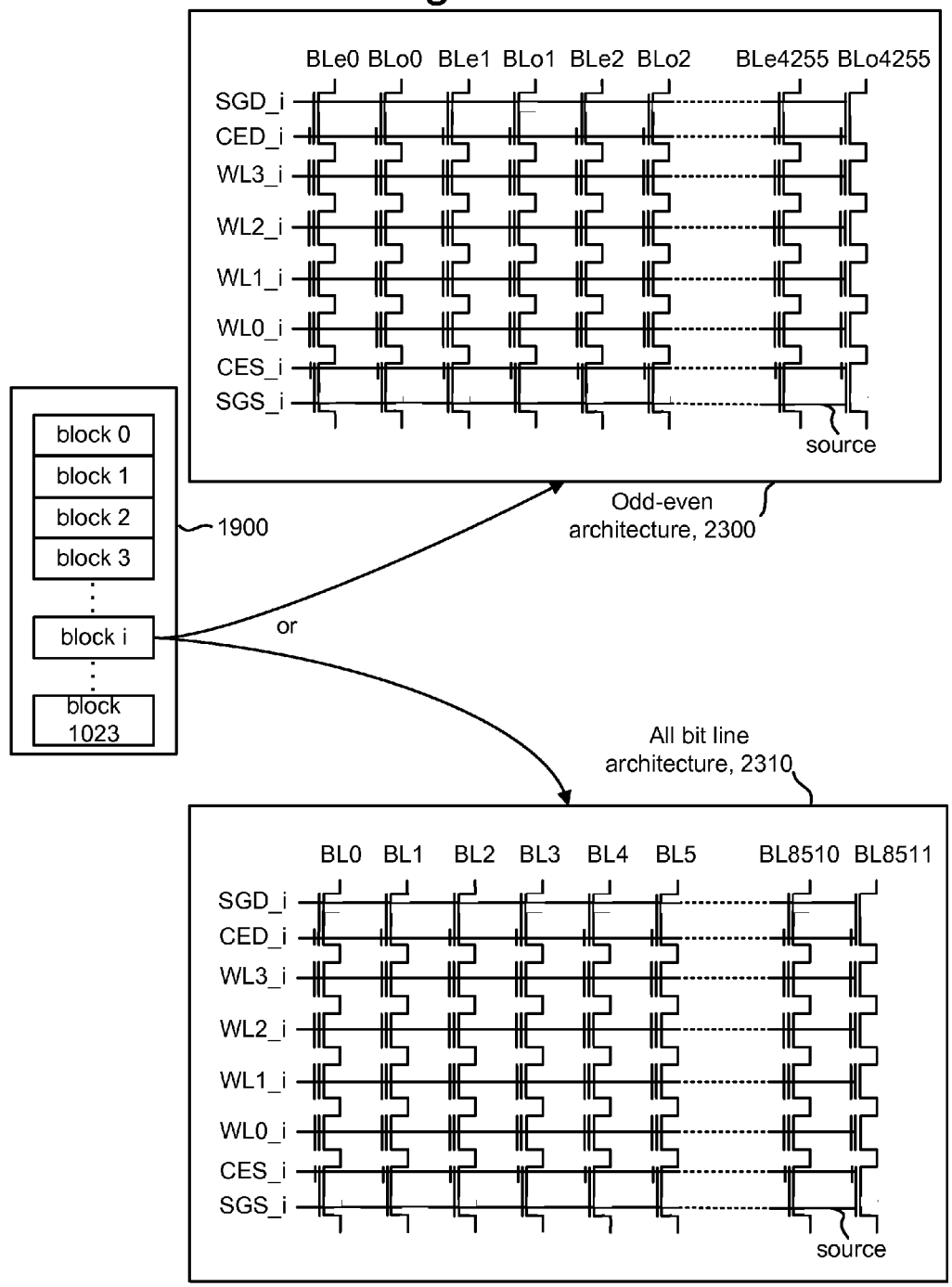
FIG. 23 illustrates an example of an organization of a memory array into blocks for an all bit line memory architecture or for an odd-even memory architecture.

FIG. 23 illustrates an example of an organization of a memory array into blocks for an all bit line memory architecture or for an odd-even memory architecture. Exemplary structures of storage element array 1900 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 2310), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to SGD and CED), and another terminal is connected to c-source via a source select gate (connected to SGS and CES).

In another embodiment, referred to as an odd-even architecture (architecture 2300), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, $V_{PASS}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bitline. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 24:
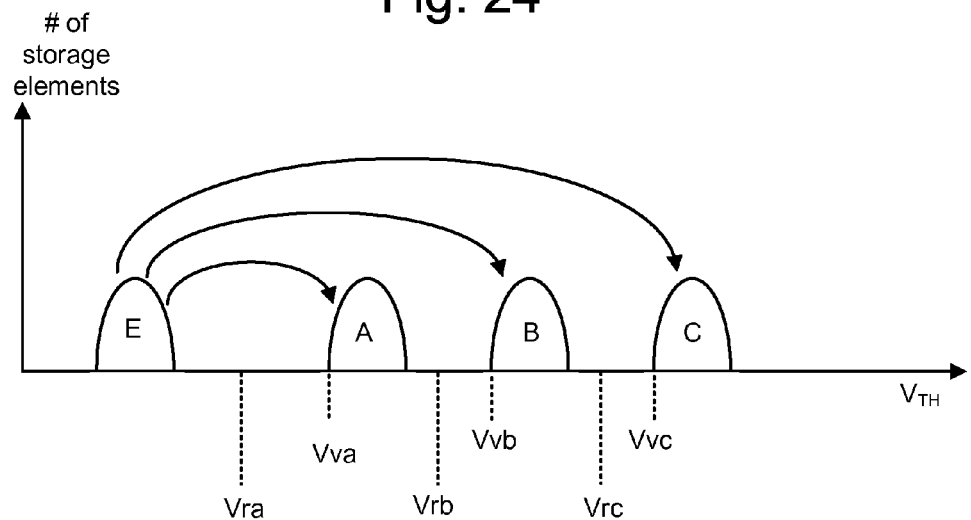
FIG. 24 depicts an example set of threshold voltage distributions.

FIG. 24 illustrates example threshold voltage distributions for the storage element array when each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Pub. No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine what state the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the control gate voltage sequence of FIG. 30 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent storage element on WLn.

Figure 25:
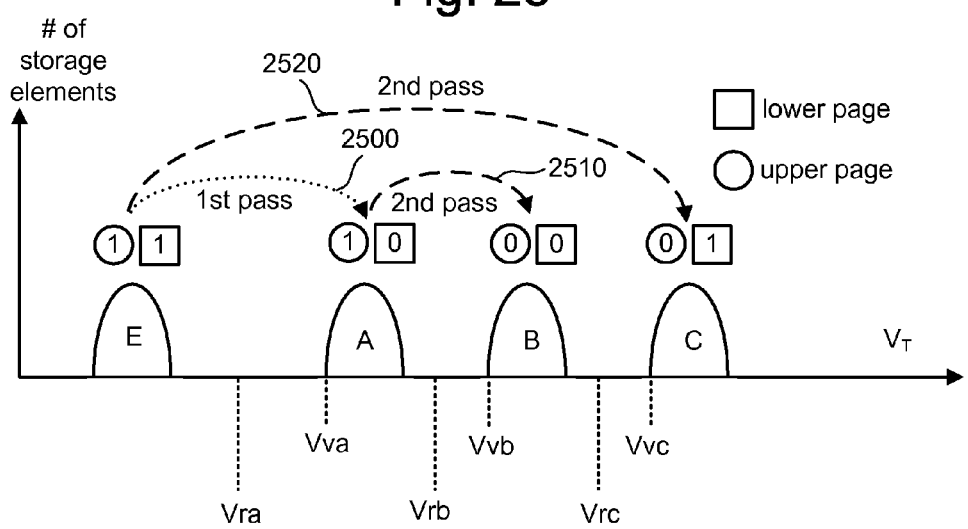
FIG. 25 depicts an example set of threshold voltage distributions.

FIG. 25 illustrates an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 2500. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 2520. If the storage element had been programmed into state A as a result of the first programming pass, then the storage element is further programmed in the second pass so that the threshold voltage is increased to be within state B, as depicted by arrow 2510. The result of the second pass is to program the storage element into the state designated to store a logic "0" for the upper page without changing the data for the lower page. In both FIG. 24 and FIG. 25 the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, and incorporated herein by reference in its entirety.

Figure 26A:
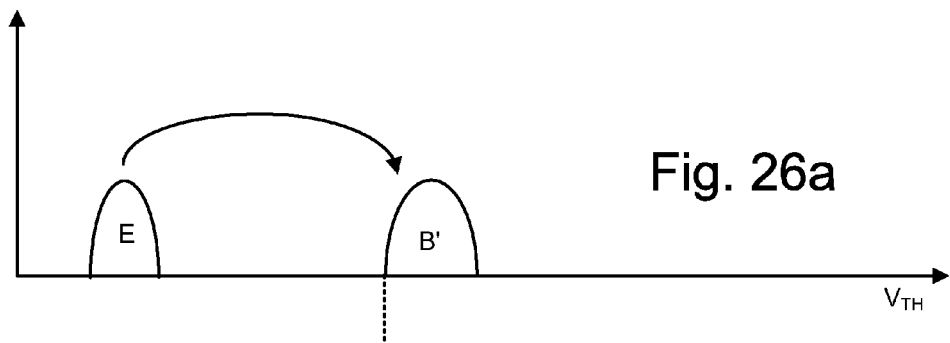
FIGS. 26a-c show various threshold voltage distributions and describe a process for programming non-volatile memory.
Figure 26B:
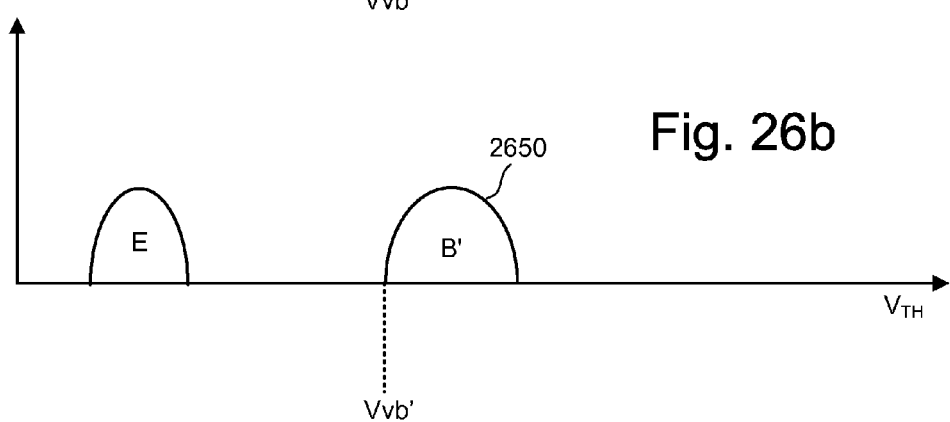
Figure 26C:
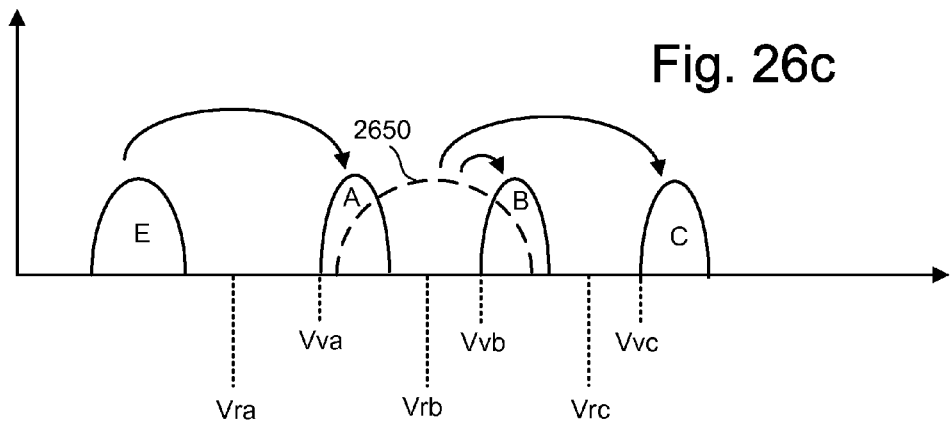

FIGS. 26a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 26A therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 3, after the lower page for storage element 346 is programmed, the lower page for storage element 345 would be programmed. After programming storage element 345, the floating gate to floating gate coupling effect will raise the apparent threshold voltage of storage element 346 if storage element 345 had a threshold voltage raised from state E to state B'. This will have the effect of widening the threshold voltage distribution for state B' to that depicted as threshold voltage distribution 2650 of FIG. 26B. This apparent widening of the threshold voltage distribution will be remedied when programming the upper page.

FIG. 26C depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 2650 and the upper page data is to remain at 1, then the storage element will be programmed to final state B. If the storage element is in intermediate threshold voltage distribution 2650 and the upper page data is to become data 0, then the threshold voltage of the storage element will be raised so that the storage element is in state C. The process depicted by FIGS. 26A-C reduces the effect of floating gate to floating gate coupling because only the upper page programming of neighbor storage elements will have an effect on the apparent threshold voltage of a given storage element. An example of an alternate state coding is to move from distribution 2650 to state C when the upper page data is a 1, and to move to state B when the upper page data is a 0.

Although FIGS. 26A-C provide an example with respect to four data states and two pages of data, the concepts taught can be applied to other implementations with more or less than four states and different than two pages.

FIG. 27 depicts a timing diagram describing various embodiments of a process for programming non-volatile memory. The horizontal axis pertains to time in units of μsec. The time period shown represents a period in which one programming pulse is applied to a selected word line. Waveforms 2700 depicts a bitline voltage, $V_{BL}$, of a NAND string, a waveform 2705 depicts a pass voltage, $V_{PASS}$, which is applied to unselected word lines, e.g., word lines which are not currently used for programming, a waveform 2710 depicts a programming voltage, $V_{PGM}$, which is applied to a selected word line which is used for programming, waveforms 2715 depicts a voltage potential which exists in the channel of a NAND string, waveforms 2720 depict voltages which are applied to select gate structures when a selected word line is a source side end word line, and waveforms 2725 depict voltages which are applied to select gate structures when a selected word line is not a source side end word line.

First, a source voltage $V_{SRC}$ (not shown) is raised from 0 V to a level such as 2.5 V at 3 μsec. Referring to waveforms 2700, at 5 μsec, $V_{BL}$ for the unselected NAND strings is raised from 0 V to $V_{SRC}$ to inhibit programming in the associated non-volatile storage elements. $V_{BL}$ remains at 0 V for the selected NAND strings during the programming in this example. Alternatively, $V_{BL}$ for the selected NAND string can have a value between 0 V and $V_{SRC}$ to reduce the programming speed without completely inhibiting it, such as in the fine mode of a coarse/fine programming technique.

Waveform 2705 depicts the voltage, $V_{UWL}$, applied to the unselected word lines. $V_{UWL}$ is set to a pass voltage, $V_{PASS}$, and corresponds to the voltage on the control gates of the storage elements connected to the unselected word lines. $V_{PASS}$ is a boosting voltage for boosting the voltage in the channel of the substrate. In particular, $V_{UWL}$ is raised to $V_{SRC}$ at 5 μsec. to allow pre-charging and then is raised to approximately 9 V at 10 μsec to boost the NAND string associated with the unselected bit lines. $V_{PASS}$ remains on the unselected word lines until approximately 35 μsec.

Waveform 2710 depicts the voltage, $V_{SWL}$, on the selected word line, which is raised to $V_{SRC}$ at 5 μsec to allow pre-charging. Between 15 μsec. and 35 μsec., the programming pulse $V_{PGM}$ is applied. In one example, the programming pulses can range between 12-21 V.

Waveforms 2715 depict the voltage in the NAND string channel ($V_{NAND}$), e.g., in the active region of the substrate. In the unselected NAND strings, $V_{NAND}$ first goes to the pre-charge level and then is boosted to approximately 7.5 V in order to inhibit programming of the unselected storage elements, while $V_{NAND}$=0 in the selected NAND string to allow programming of the selected storage elements.

Waveforms 2720 depict the source side select gate and coupling electrode voltages, $V_{SGS}$ and $V_{CES}$, respectively, which are applied to a source side select gate structure, in addition to the drain side select gate and coupling electrode voltages, $V_{SGD}$ and $V_{CED}$, respectively, which are applied to a drain side select gate structure. In this case, the selected word line is a source side end word line, e.g., WL0. As mentioned previously, the voltages applied to the coupling electrode can be set based on the position of the currently programmed non-volatile storage element in a NAND string, or the position of the corresponding selected word line among a set of multiple word lines. In one approach, when the currently selected word line is a source side end word line, that is, a word line adjacent to the source side select gate structure, $V_{CES}$ is set to an elevated level, higher than $V_{SGS}$, such as 8 V or other voltage level which the associated dielectric can withstand, during programming. The voltage level which the associated dielectric can withstand is based on factors such as the dielectric material, thickness of the dielectric, age and number of programming cycles experienced. A value can be obtained from experimentation, for instance.

It is also possible to set $V_{CES}$ to an elevated level when the currently selected word line is other than a source side end word line. $V_{SGS}$ is set to a level such as 0 V to maintain the source side select gate closed. $V_{SGD}$ is set to a level such as 2.5 V after a brief pre-charge to a higher level such as 5 V to maintain the drain side select gate open. $V_{CED}$ can be set to a constant 0 V or can track $V_{SGD}$. Moreover, controlling $V_{CED}$ and $V_{SGD}$ in concert, including ramping them up and/or down together (in the same polarity direction), as depicted in FIG. 27, provides mutual coupling that will reinforce their charging or discharging. Generally, the voltages which are applied to the select gate and coupling electrode of a source or drain side select gate structure can be simultaneously ramped up or down so that their mutual coupling will reinforce their charging or discharging. In another alternative, $V_{CED}$ can be set to a relatively high level, such as a level which is comparable to $V_{CES}$, since this can assist in channel boosting which, in turn, assists in programming.

Waveforms 2725 depict $V_{SGS}$, $V_{CES}$, $V_{SGD}$ and $V_{CED}$ when the currently selected word line is not a source side end word line. In this case, $V_{CES}$ is set to a reduced level such as 0 V which tracks $V_{SGS}$. $V_{SGD}$ and $V_{CED}$ are set as indicated in the previous case (waveforms 2720). Generally, the benefit of providing an elevated voltage on the source side coupling electrode may be diminished when the currently selected word line is not a source side end word line, in which case $V_{CES}$ has a passive role.

Note that when a drain side select gate structure having a select gate and coupling electrode is used, it may be controlled by analogy to the discussion in connection with waveforms 2720 and 2725. In particular, $V_{CED}$ can be elevated when the selected word line is a drain side end word line and reduced to track $V_{SGD}$ in other cases. In particular, when the selected word line is a drain side end word line, $V_{CED}$ and $V_{CES}$ can be set as indicated by waveforms 2720 but where $V_{CED}$ and $V_{CES}$ are swapped.

As mentioned, the use of an elevated voltage for the coupling electrode can reduce GIDL when programming non-volatile storage elements via an adjacent word line. This improves programming efficiency and can allow a reduced maximum $V_{PGM}$ to be used. Further, it may also be desirable to use an elevated $V_{CES}$ and/or $V_{CED}$ when the selected word line is not directly adjacent to the select gate. The level of $V_{CES}$ and/or $V_{CED}$ can also vary based on the position of the selected word line. Another option is to allow $V_{CES}$ and/or $V_{CED}$ to float when the selected word line is adjacent to the select gate.

FIG. 28 depicts a timing diagram describing various embodiments of a process for reading non-volatile memory. The horizontal axis pertains to time in units of μsec. The time period shown represents a period in which a read operation is carried out, e.g., to verify whether a storage element has completed programming or to read data from a previously programmed storage element.

Waveforms 2800 depict bitline voltages, $V_{BL}$, of NAND strings for two read options, referred to as options A and B, a waveform 2805 depicts a read voltage, $V_{READ}$, which is applied to unselected word lines, e.g., word lines associated with storage elements which are not currently being read, and a waveform 2810 depicts a read control gate voltage, $V_{CGR}$, which is applied to control gates of storage elements of a selected word line, e.g., a word line associated with one or more storage elements which are currently being read. A waveform 2815 depicts a voltage potential which exists in the channel of unselected NAND strings, e.g., NAND strings associated with storage elements which are not currently being read, and waveforms 2820 depict a voltage which exists in the channel of selected NAND strings, e.g., NAND strings associated with storage elements which are currently being read, for the two read options. Waveform 2825 depicts $V_{SGD}$, $V_{CED}$, $V_{SGS}$ and $V_{CES}$ for the two read options.

In waveform 2805, $V_{READ}$ is chosen at a level which is sufficiently higher than the highest threshold voltage of a storage element to ensure that the unselected storage elements are in a conductive or on state. For example, the threshold voltages for states E, A, B and C may be −2 V, 0 V, 2 V and 4 V, respectively, and $V_{READ}$ may be 6 V.

In one read option (option A), the source side select gate is turned on by raising $V_{SGS}$, e.g., at t=22 μsec., as depicted by waveforms 2825. This provides a path to dissipate the charge on the bit line. $V_{CES}$ can also be raised with $V_{SGS}$ or fixed at a steady state level, e.g., 0 V. $V_{SGD}$ is raised starting at t=0 μsec. so that the drain side select gate is turned on. $V_{CED}$ can also be raised with $V_{SGD}$ or fixed at a steady state level. If the threshold voltage of the storage element selected for reading is greater than $V_{CGR}$, the read level applied to the selected word line, then the selected storage element will not turn on and the bit line will not discharge, as depicted by waveforms 2800 ("$V_{BL}$ doesn't discharge"). For example, $V_{CGR}$ can be set to Vra, Vrb, or Vrc for a read operation, or to Vva, Vvb, or Vvc for a verify operation (FIG. 26C). $V_{NAND}$ of the selected NAND string will not dissipate in this case, as indicated by waveforms 2820. If the threshold voltage in the storage element selected for reading is below $V_{CGR}$, then the selected storage element will turn on (conduct) and the bit line voltage will dissipate, also as depicted by waveforms 2800 ("$V_{BL}$ discharges"). $V_{NAND}$ of the selected NAND string will dissipate in this case, as indicated by waveforms 2820. Some point later (as determined by the particular implementation), between 22 and 40 μsec., the sense amplifier will determine whether the bit line has dissipated a sufficient amount by measuring the evaluated BL voltage. At t=40 μsec., $V_{SGS}$, $V_{CES}$, $V_{SGD}$ and $V_{CED}$ are lowered to a steady state level (or another value for standby or recovery).

For a second read option (option B), sensing circuits and the array of storage elements measure the conduction current of a storage element by the rate at which it charges a dedicated capacitor in the sense amplifier. The source side select gate is turned on by raising $V_{SGS}$, e.g., at t=5 μsec., as depicted by waveforms 2825. $V_{SGD}$ is also raised starting at t=5 μsec. so that the drain side select gate is turned on. $V_{CES}$ can be raised with $V_{SGS}$ or fixed at a steady state level and $V_{CED}$ can be raised with $V_{SGD}$ fixed at a steady state level. The sense amplifier holds the bit line voltage constant regardless of what the NAND string is doing, so the sense amplifier measures the current flowing with the bit line "clamped" to that voltage. At some point after t=5 μsec. and prior to t=40 μsec. (as determined by the particular implementation), the sense amplifier will determine whether the capacitor in the sense amplifier has dissipated a sufficient amount. At t=40 μsec., $V_{SGS}$, $V_{CES}$, $V_{SGD}$ and $V_{CED}$ are lowered to a steady state value (or another value for standby or recovery). Note that in other embodiments, the timing of some of the waveforms can be changed.

Figure 29:
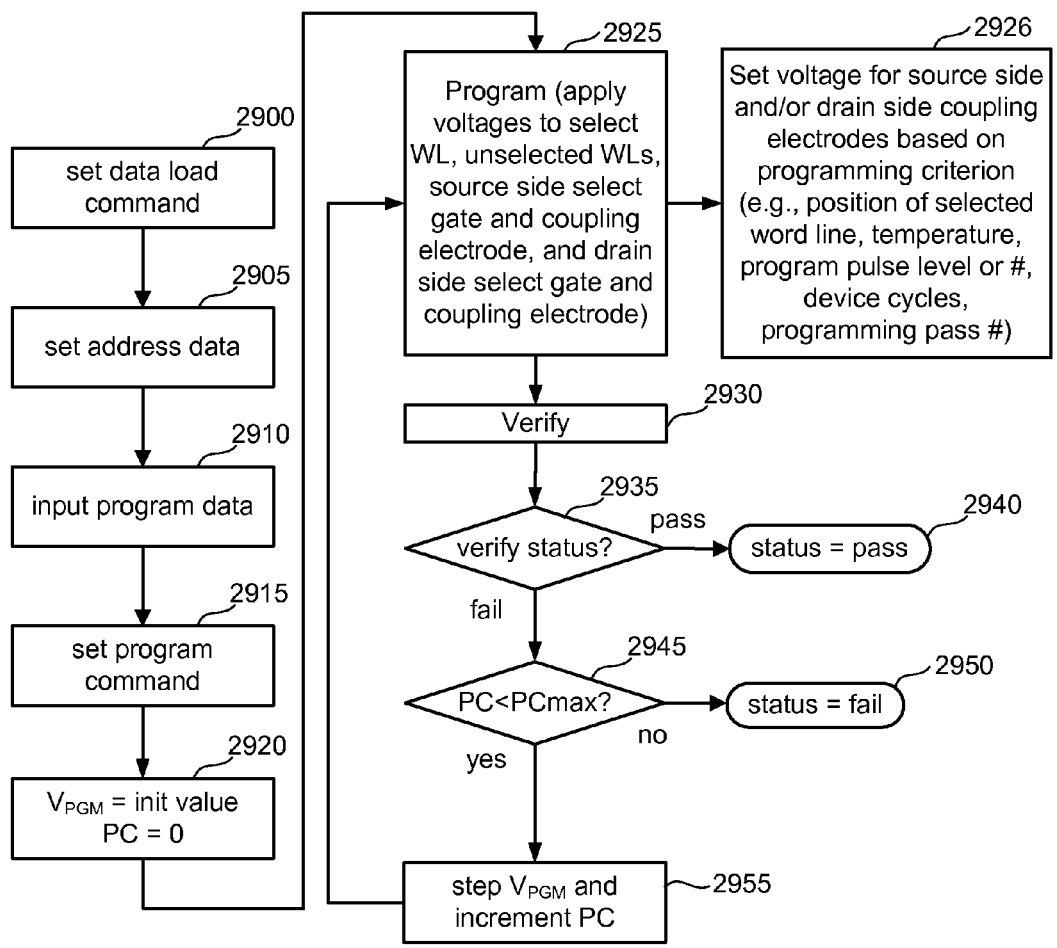
FIG. 29 is a flow chart describing one embodiment of a process for programming non-volatile memory.

FIG. 29 is a flow chart describing one embodiment of a method for programming non-volatile memory. In one implementation, storage elements are erased (in blocks or other units) prior to programming. In step 2900, a "data load" command is issued by the controller and input received by control circuitry 2010 (FIG. 20). In step 2905, address data designating the page address is input to decoder 2014 from the controller or host. In step 2910, a page of program data for the addressed page is input to a data buffer for programming. That data is latched in the appropriate set of latches. In step 2915, a "program" command is issued by the controller to state machine 2012.

Figure 30:
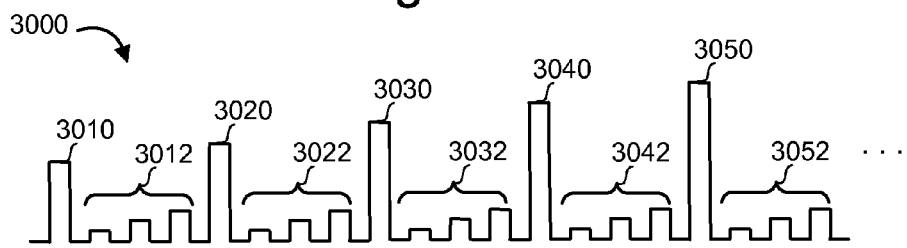
FIG. 30 depicts an example waveform applied to the control gates of non-volatile storage elements during programming.

Triggered by the "program" command, the data latched in step 2910 will be programmed into the selected storage elements controlled by state machine 2012 using the stepped pulses 3010, 3020, 3030, 3040, 3050, ... of FIG. 30 applied to the appropriate word line. In step 2920, the program voltage, $V_{PGM}$, is initialized to the starting pulse (e.g., 12 V or other value) and a program counter PC maintained by state machine 2012 is initialized at zero. In step 2925, the first $V_{PGM}$ pulse is applied to the selected word line to begin programming storage elements associated with the selected word line, and appropriate voltages are applied to the unselected word lines, the source side select gate and coupling electrode and the drain side select gate and coupling electrode. For example, as shown at step 2926, the voltages for the source side coupling electrode and/or drain side coupling electrode can be set based on various programming criterion, such as position of selected word line, temperature, program pulse level or number, number of device cycles, and programming pass number when multi-pass programming is used, as explained further in connection with FIGS. 31a-e. A combination of different criteria can be used as well. The voltages for the source side coupling electrode and/or drain side coupling electrode can be set based on other criteria as well such as criteria relating to reading and verifying processes.

If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to $V_{DD}$ to inhibit programming.

In step 2930, the states of the selected storage elements are verified using appropriate verify voltages. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 2935, a determination is made as to whether all of the data latches are storing logic "1." If so, the programming process is complete and successful because all selected storage elements were programmed and verified, and a status of "PASS" is reported in step 2940.

If, in step 2935, it is determined that not all of the data latches are storing logic "1," then the programming process continues. In step 2945, the program counter PC is checked against a program limit value PCmax. One example of a program limit value is twenty; however, other numbers can also be used. If the program counter PC is not less than PCmax, then the program process has failed and a status of "FAIL" is reported in step 2950. If the program counter PC is less than PCmax, then the $V_{PGM}$ level is increased by the step size and the program counter PC is incremented in step 2955. After step 2955, the process loops back to step 2925 to apply the next $V_{PGM}$ pulse.

FIG. 30 shows a voltage waveform 3000 which includes a series of program pulses 3010, 3020, 3030, 3040, 3050, . . . , that are applied to a word line selected for programming. In one embodiment, the programming pulses have a voltage, $V_{PGM}$, which starts at 12 V and increases by increments, e.g., 0.5 V, for each successive programming pulses until a maximum of 21 V is reached. In between the program pulses are sets of verify pulses 3012, 3022, 3032, 3042, 3052, . . . . In some embodiments, there can be a verify pulse for each state that data is being programmed into. In other embodiments, there can be more or fewer verify pulses. The verify pulses in each set can have amplitudes of Vva, Vvb and Vvc (FIG. 25), for instance.

In one embodiment, data is programmed to storage elements along a common word line. Thus, prior to applying the program pulses, one of the word lines is selected for programming. This word line is referred to as the selected word line. The remaining word lines of a block are referred to as the unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 of FIG. 3 is the selected word line, then WL1 is the source side neighboring word line and WL3 is the drain side neighboring word line.

Each block of storage elements includes a set of bit lines forming columns and a set of word lines forming rows. In one embodiment, the bit lines are divided into odd bit lines and even bit lines. As discussed in connection with FIG. 23, storage elements along a common word line and connected to the odd bit lines are programmed at one time, while storage elements along a common word line and connected to even bit lines are programmed at another time ("odd/even programming"). In another embodiment, storage elements are programmed along a word line for all bit lines in the block ("all bit line programming"). In other embodiments, the bit lines or block can be broken up into other groupings (e.g., left and right, more than two groupings, etc.)

Figure 31A:
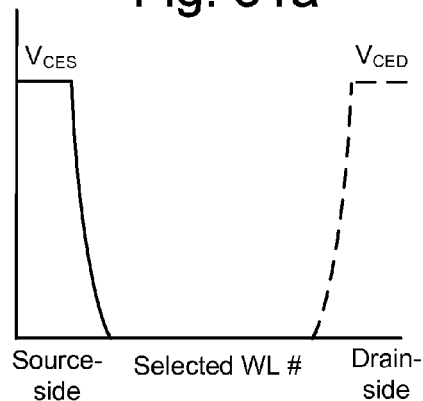
FIG. 31a depicts a relationship between coupling electrode voltage and selected word line position.

FIG. 31*a* depicts a relationship between coupling electrode voltage and selected word line position. In the graph shown, the horizontal axis denotes word line number which extends from a source side, e.g., WL0 to a drain side, e.g., WL31, for a 32-word line NAND string, and the vertical axis denotes voltage level. In this example, $V_{CES}$, shown by a solid line, is provided at an elevated level for one or more selected word lines on the source side, and declines when higher word lines are selected word lines. Similarly, $V_{CED}$, shown by a dashed line, is provided at an elevated level for one or more selected word lines on the drain side, and declines when lower word lines are selected word lines.

Figure 31D:
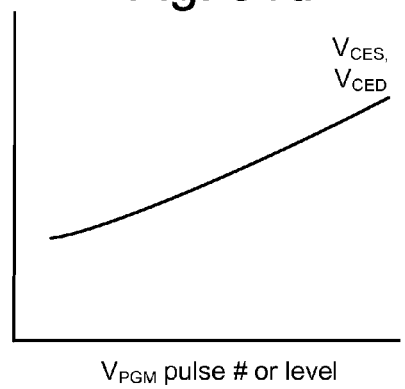
FIG. 31d depicts a relationship between coupling electrode voltage and programming pulse number or voltage.
Figure 31B:
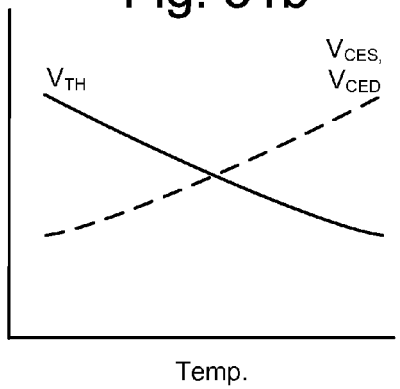
FIG. 31b depicts a relationship between threshold voltage and temperature, and between coupling electrode voltage and temperature.

FIG. 31*b* depicts a relationship between threshold voltage and temperature, and between coupling electrode voltage and temperature. In the graph shown, the horizontal axis denotes temperature and the vertical axis denotes voltage. In particular, it has been observed that the threshold voltage ($V_{TH}$) of a non-volatile storage element decreases as temperature increases. The change in voltage relative to the change in temperature can be expressed in terms of a temperature coefficient ($\alpha$) which is typically about $-2$ mV/° C. With an operating range of $-40°$ C. to $+85°$ C., for instance, the threshold voltage can vary by about $(85-(-40))\times(-2)=250$ mV. The temperature coefficient depends on various characteristics of the memory device, such as doping, layout and so forth. Accordingly, in one approach, the coupling electrode voltage can be increased as temperature increases to provide further assistance in increasing the $V_{TH}$ of a storage element.

Figure 31E:
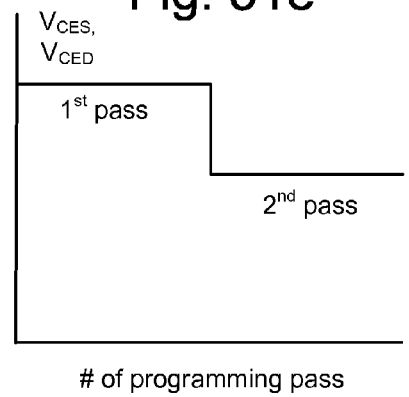
FIG. 31e depicts a relationship between coupling electrode voltage and programming pass number for multi-pass programming techniques.
Figure 31C:
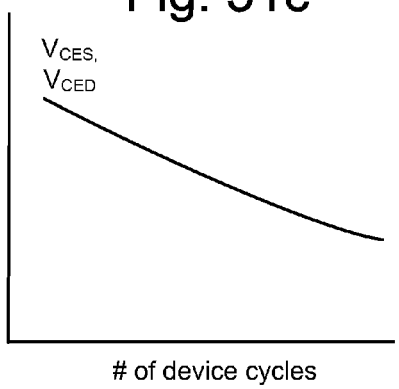
FIG. 31c depicts a relationship between coupling electrode voltage and number of memory device cycles.

FIG. 31*c* depicts a relationship between coupling electrode voltage and number of memory device cycles. As a memory device undergoes many program and erase cycles over time, the storage elements generally become easier to program and can reach their target programming state with fewer programming pulses. Accordingly, in one approach, the assistance provided by the coupling electrode can be decreased as the number of cycles increases by reducing the coupling electrode voltage. A count of the number of cycles which is maintained by the memory device can be used for this purpose.

FIG. 31*d* depicts a relationship between coupling electrode voltage and programming pulse number or voltage. As successive programming pulses with higher amplitudes are applied to a selected storage element during programming (see, e.g., FIG. 30), the amount of assistance provided by the coupling electrodes can be increased by increasing the level of the coupling electrode voltage. The coupling electrode voltage can therefore be adjusted based on the number of the programming pulse, e.g., first, second, third, etc. and/or, analogously, the level of $V_{PGM}$, e.g., 10 V, 11 V, etc.

FIG. 31*e* depicts a relationship between coupling electrode voltage and programming pass number for multi-pass programming techniques. For multi-pass programming techniques such as those shown in FIGS. 25-26*c*, it can be beneficial to adjust the coupling electrode voltage according to which programming pass is occurring. In one approach, the first programming pass results in a larger increase in the $V_{TH}$ of the programmed storage elements than in the second programming pass. In this case, more assistance is needed from the coupling electrodes in the first pass, so the coupling electrode voltage is increased in the first pass.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating a select gate structure, comprising:
    forming a first conductive portion over a substrate;
    forming a dielectric portion over a first part of the first conductive portion and over the substrate;
    forming a conductive layer over the first conductive portion and the dielectric portion;
    etching the conductive layer to form spaced apart second and third conductive portions, the second conductive portion being over the dielectric portion and electrically isolated from the first conductive portion by the dielectric portion, and the third conductive portion is over, and electrically contacting, a second part of the first conductive portion; and
    forming control lines for independently driving the first and second conductive portions.

2. The method of claim 1, wherein:
the third conductive portion forms part of one of the control lines.

3. The method of claim 2, wherein:
the third conductive portion is spaced apart from the second conductive portion in a bit line direction.

4. The method of claim 1, wherein:
the first conductive portion provides at least part of a select gate; and
the second conductive portion provides a coupling electrode.

5. The method of claim 1, wherein:
the first and second conductive portions extend in a word line direction.

6. The method of claim 1, further comprising:
forming source/drain regions in the substrate adjacent to either side of the first conductive portion.

7. A method for fabricating a select gate structure, comprising:
forming a first conductive portion over an insulating layer on a substrate;
forming a second conductive portion over a first part of the first conductive portion, the second conductive portion being electrically coupled to the first conductive portion;
forming a dielectric portion over a second part of the first conductive portion;
forming a third conductive portion over the dielectric portion, the third conductive portion being electrically isolated from the first conductive portion by the dielectric portion and spaced apart from the second conductive portion, the second and third conductive portions are formed by forming a conductive layer over the first conductive portion and the dielectric portion and etching the conductive layer; and
forming a protective dielectric layer which covers an exposed portion of the first conductive portion between the second and third conductive portions.

8. The method of claim 7, wherein:
the first and second conductive portions provide a select gate; and
the third conductive portion provides a coupling electrode.

9. The method of claim 8, wherein:
the select gate and coupling electrode are independently drivable.

10. The method of claim 7, wherein:
the second and third conductive portions extend in a word line direction.

11. The method of claim 7, wherein:
the third conductive portion is spaced apart from the second conductive portion in a bit line direction.

12. The method of claim 7, further comprising:
forming first and second source/drain regions in the substrate, the first conductive portion extending continuously between, in a bit line direction, the first and second source/drain regions.

13. The method of claim 7, wherein:
the first conductive portion is formed from a first polysilicon layer; and
the conductive layer from which the second and third conductive portions are formed is a second polysilicon layer.

14. The method of claim 7, wherein:
the protective dielectric layer covers opposing side walls of the second and third conductive portions.

* * * * *